United States Patent [19]

Uemura

[11] Patent Number: 5,555,135
[45] Date of Patent: Sep. 10, 1996

[54] ILLUMINATION SYSTEM

[75] Inventor: Haruo Uemura, Kyoto, Japan

[73] Assignee: Dainippon Screen Manufacturing Co., Ltd., Japan

[21] Appl. No.: 546,551

[22] Filed: Jun. 29, 1990

[30]    Foreign Application Priority Data

Jun. 29, 1989 [JP] Japan .................................. 1-167429
Jul. 21, 1989 [JP] Japan .................................. 1-190157

[51] Int. Cl.⁶ .......................... G02B 5/08; G02B 5/10; F21V 7/00
[52] U.S. Cl. .................. 359/851; 359/857; 359/858; 362/298; 362/346
[58] Field of Search .................................. 350/612, 618, 350/619, 625, 628, 629; 362/268, 296, 341, 298, 346, 297, 301; 359/727, 730, 731, 851, 853, 857, 858, 859, 861; 355/53

[56]          References Cited

U.S. PATENT DOCUMENTS

| | | | |
|---|---|---|---|
| 3,697,154 | 10/1972 | Johnson | 359/859 |
| 4,037,943 | 7/1977 | Anzai | 359/859 |
| 4,205,902 | 6/1980 | Shafer | 359/859 |
| 4,577,959 | 3/1986 | Yazaki | 355/53 |
| 4,634,276 | 1/1987 | Sharpe | 359/858 |
| 4,639,127 | 1/1987 | Beery et al. | 250/208.1 |
| 4,643,545 | 2/1987 | Vanderwall | 359/869 |
| 4,747,030 | 5/1988 | Offner et al. | 362/302 |
| 4,762,411 | 8/1988 | Pitalo et al. | 359/857 |
| 4,773,756 | 9/1988 | Blechinger | 356/334 |
| 4,974,138 | 11/1990 | Negishi | 362/347 |
| 5,005,959 | 4/1991 | Nagata et al. | 350/452 |

FOREIGN PATENT DOCUMENTS

| | | | |
|---|---|---|---|
| 0133631 | 8/1982 | Japan | 359/861 |
| 59-151101 | 8/1984 | Japan | 350/630 |
| 1420583 | 8/1988 | U.S.S.R. | 359/857 |

OTHER PUBLICATIONS

Walter G. Driscoll, Handbook of Optics, pp. 2–3 to 2–6, USA.

Primary Examiner—Ricky D. Shafer
Attorney, Agent, or Firm—Ostrolenk, Faber, Gerb & Soffen, LLP

[57]          ABSTRACT

An illumination system for illuminating a surface includes a reflecting element having a finite focal length. A light source is located at a point, close to a focal point of the reflecting element, which is deviated from the principal axis of the reflecting element. Light from the light source is reflected by the reflecting element, whereby light with parallel rays is directed toward the surface. The surface is illuminated with symmetrical illuminance distribution with respect to the optical axis of the light.

10 Claims, 11 Drawing Sheets

ILLUMINATION SYSTEM

BACKGROUND OF THE INVENTION

1. Field of the Invention

The present invention relates to an illumination system for reflecting light from a light source (or a secondary light source) by a reflecting optical element such as a spherical mirror, a parabolic mirror or the like and for directing reflected light with parallel rays toward a surface to be illuminated.

2. Description of the Prior Art

Exposure apparatus is used for printing a prescribed pattern on a printed board, a liquid crystal substrate or the like. It is regarded as preferable that an illumination system for use within the exposure apparatus be capable of directing parallel rays onto a surface of the printed board, for example. To satisfy this requirement, the illumination system generally utilizes a reflection type collimator.

FIG. 1 schematically illustrates the structure of an illumination system including a reflection type collimator, which provides a background for the understanding of the present invention. Referring to FIG. 1, the illumination system includes a spherical mirror 1 and a secondary light source 2. The secondary light source 2 is located at a point close to a focal point of the spherical mirror 1 and deviated from a principal axis 1b thereof. The principal axis 1b is defined as a symmetry axis through a center of symmetry for the spherical mirror 1. Illuminating light from the secondary light source 2 is reflected by a reflecting surface 1a of the spherical mirror 1, and then guided toward an illuminated surface 3. As seen in FIG. 1, the spherical mirror 1 is so arranged that its principal axis 1b is inclined at a prescribed angle $\theta$ to an optical axis 4 of the illuminating system. In order to simplify the following description, the angle $\theta$ is hereinafter referred to an off-axis angle.

The size of the illumination system shown in FIG. 1 is increased proportionally to a distance L between the spherical mirror 1 and the illuminated surface 3. Consequently, an exposure apparatus, to which the illumination system is applied, attains a great size as the distance L is increased. In general, however, such an exposure apparatus be of small size. Accordingly, the distance L between the spherical mirror 1 and the illuminated surface 3 is generally set at a relatively small value as compared with a focal length f of the spherical mirror 1.

As is well known, the illuminated surface 3 must be illuminated as uniformly as possible. It has been considered difficult to illuminate the surface 3 with uniform illuminance by merely appropriately setting designed values, such as the distance L, in the illumination system, because the secondary light source 2 is located on the point deviated from the principal axis 1b of the spherical mirror 1.

The foregoing problem may be overcome in the following manner: The illumination system is designed so that illuminance distribution on the illuminated surface 3 is symmetrical with respect to the optical axis of the illuminating system. Furthermore, an appropriate element is added to said illumination system. The element maybe a fly-eye lens, with a characteristic of correcting illuminance distribution on the illuminated surface 3, which is used as the secondary light source 2. Thus, the illuminated surface 3 can be illuminated with uniform illuminance. In such an approach, it is desired that the illuminance distribution on the illuminated surface 3 is substantially symmetrical with respect to the optical axis of the illuminating system.

The conventional illumination system is merely designed so that the distance L is relatively shorter than the focal length f of the spherical mirror 1 in order to simply reduce the size of the apparatus; no consideration is made as to the resultant illuminance distribution on the illuminated surface 3. If, illuminance distribution on the illuminated surface 3 is asymmetrical with respect to the optical axis of the illuminating system, as shown in FIG. 2 for example, such asymmetry causes a significant problem as an effective illuminated region of the illuminated surface 3 is increased, but substantially no problem takes place if the effective illuminated region is small. Referring to the effective illuminated region having dimensions of 0.4 f by 0.4 f, for example, difference in illuminance between both ends (points separated from the optical axis at distances of −0.2 f and 0.2 f) is $\Delta I_1$ as shown in FIG. 2. On the other hand, such difference is $\Delta I_2$ ($> \Delta I_1$) if the dimensions of the effective illuminated region is set at 0.8 f by 0.8 f. As will be understood from FIG. 2, the difference in illuminance between the ends of the effective illuminated region is increased as the effective illuminated region is increased in size when illuminance distribution is asymmetrical. Particularly with increase in size of the printed board etc. to be subjected to pattern printing, the region to be illuminated with parallel rays is widened to increasingly raise the problem of asymmetrical illuminance distribution in the effective illuminated region.

SUMMARY OF THE INVENTION

The present invention relates to an illumination system for illuminating a surface by light with parallel rays, comprising: a reflecting element having a finite focal length; and a light source located at a point close to a focal point of the reflecting element, the point being deviated from a principal axis of the reflecting element; the illumination system satisfies the following inequality:

$$f\{1-K(1-(D/f)^2)\} \leq L \leq f\{1+K(1-(D/f)^2)\}$$

where f: focal length of the reflecting element

D: dimension of the surface

L: distance between the reflecting element and the surface

K= 0.67 (when 0.58> (D/f))

K= $2(D/f)^2$ (when 0.58≤(D/f)).

The present invention also relates to an illumination system for illuminating a surface by light with parallel rays, comprising: a Fresnel mirror having a finite focal length; and a light source located at a point close to a focal point of the Fresnel mirror, the point being deviated from a principal axis of the Fresnel mirror.

The present invention further relates to an illumination system for illuminating a surface by light with parallel rays, comprising: a reflecting means having a finite focal length, the reflecting element including a plurality of reflecting elements, principal axes of the reflecting elements being shifted from each other; and a light source located at a point close to a focal point of the reflecting means, the point being deviated from a principal axis of the reflecting means.

A principal object of the present invention is to provide an illumination system which can illuminate a surface to be illuminated with symmetrical illuminance distribution with respect to the optical axis of illuminating system.

Another object of the present invention is to provide an illumination system employing a reflection type collimator, which can be reduced in size while ensuring symmetrical illuminance distribution on an effective illuminated region of an illuminated surface.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for explaining a declination angle;

DESCRIPTION OF THE PREFERRED EMBODIMENTS

A. Outline of the Invention

As hereinabove described, the conventional illumination system has generally been designed to reduce the distance L, only in view of miniaturization of the illumination system. While the relationship between the distance L and the illuminance distribution has never been taken into consideration. Accordingly, the influence of the distance L on the illuminance distribution will now be discussed in detail.

Figure 1:
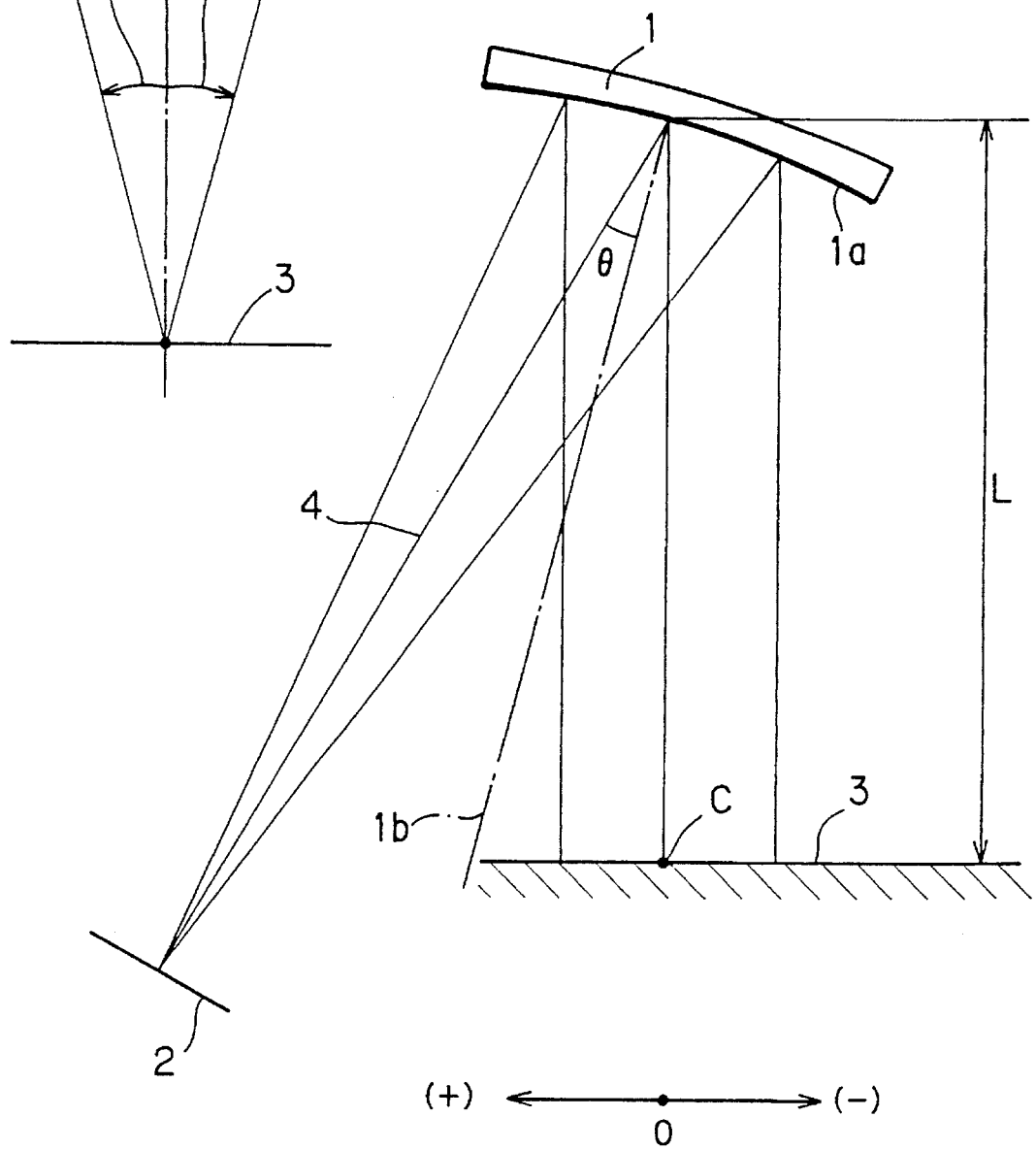
FIG. 1 is a block diagram showing an illumination system.

The relationship therebetween in the illumination system shown in FIG. 1 is obtained by a computer simulation under the following conditions:

(1) Light from the secondary light source 2 is incident upon the illuminated surface with uniform illuminance distribution if the collimator is of a transmission type which is symmetrical with respect to the optical axis;

(2) The off-axis angle $\theta$ is 15°; and (3) The distance L between the spherical mirror 1 and the illuminated surface 3 is set at 0.7, 1 and 1.3 times the focal length f of the spherical mirror 1, respectively.

Figure 2:
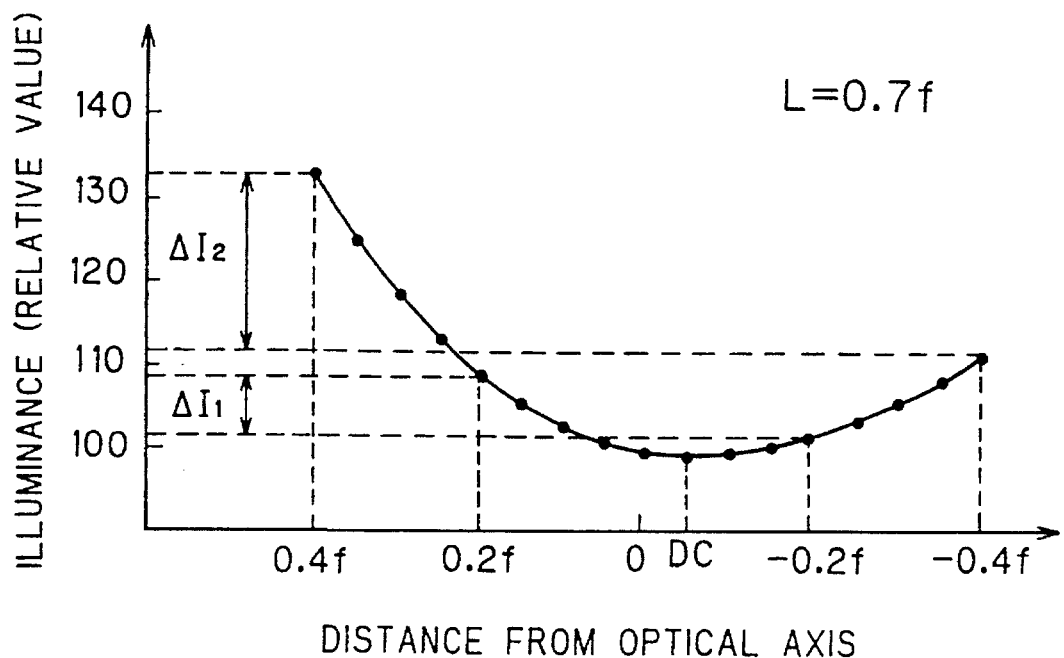
FIGS. 2 to 4 are graphs showing illuminance distribution on an illuminated surface when a reflecting optical element is formed by a spherical mirror.
Figure 3:
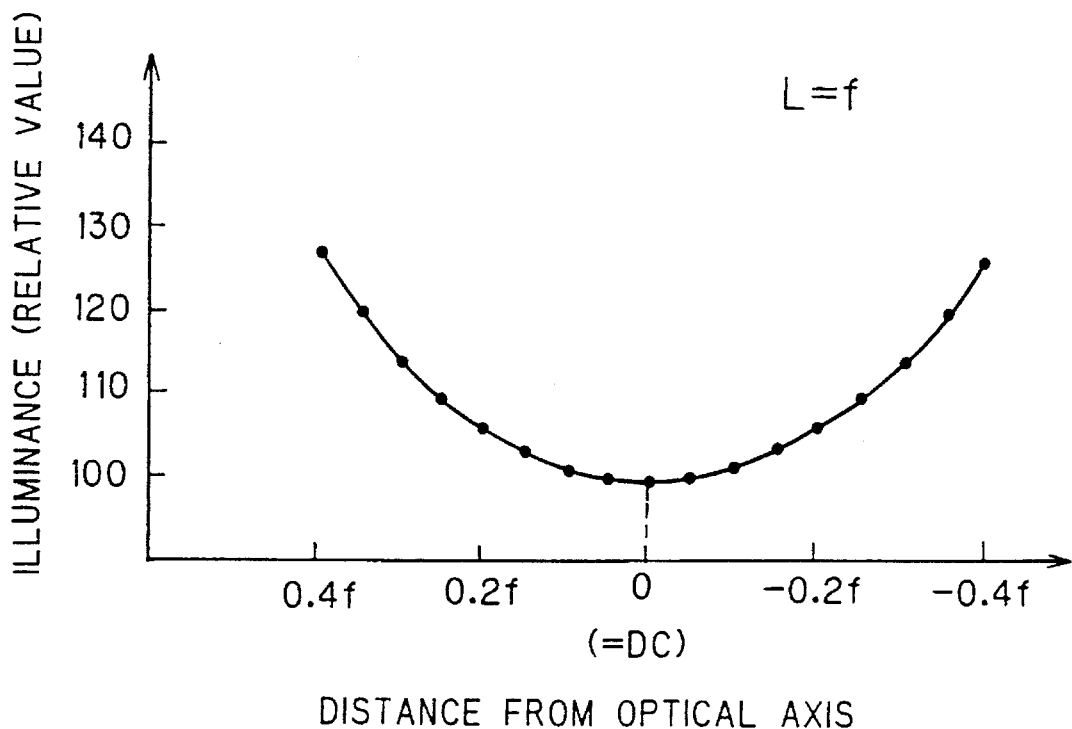
Figure 4:
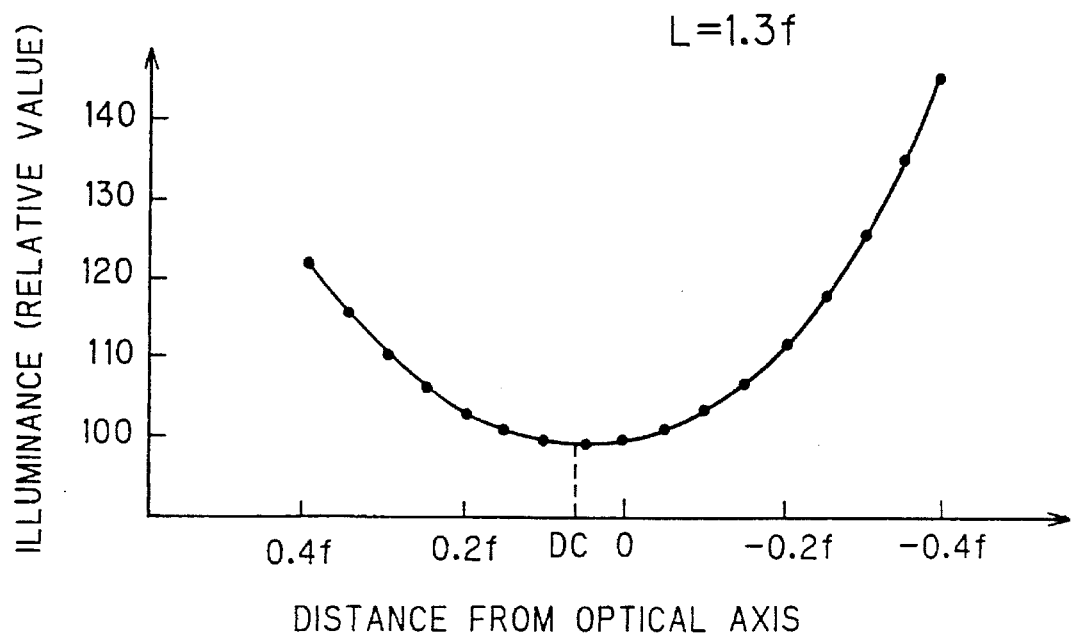

FIGS. 2 to 4 illustrates results of the computer simulations, respectively.

FIG. 2 shows illuminance distribution on the effective illuminated region of the illuminated surface 3 in relation to the distance L being set at 0.7 times the focal length f of the spherical mirror 1. FIG. 3 shows illuminance distribution on the region in relation to the distance L being set at focal length f thereof. FIG. 4 shows illuminance distribution on the region in relation to the distance L being set at 1.3 times the focal length f thereof. Referring to each of these figures, the horizontal line shows a distance from a intersection C (see FIG. 1) at which the optical axis of the illuminating system crosses the illuminated surface 3. Positive value are measured to the left with respect to the intersection C, negative value to right. On the other hand, the vertical line shows illuminance (relative value) at each point of the illuminated surface 3 with respect to illuminance of 100 at the intersection C.

Referring to the conventional illumination system, the distance L is set at about 0.7 times the focal length f of the spherical mirror 1. Therefore, illuminance distribution of the conventional illumination system is similar to that shown in FIG. 2. A distribution center DC of the illuminance is located in a minus side (right-hand side of the figure) when the illuminated surface 3 is illuminated by the conventional illumination system. Thus, the illuminated surface 3 is asymmetrically illuminated with respect to the optical axis.

As will be understood from FIGS. 2 to 4, the illuminance distribution on the illuminated surface 3 is varied with change in the distance L. In other words, the distribution center DC of the illuminance is shifted from the minus side to the plus side (left-hand side of the figure) as the distance L is increased. Particularly when the distance L is set at the same value as the focal length f of the spherical mirror 1 (FIG. 3), the distribution center DC substantially coincides with the intersection C. Therefore, the illuminance distribution is substantially symmetrical with respect to the optical axis of the illuminating system.

Variance of illuminance distribution will now be discussed. Table 1 shows declination angles $\alpha$ obtained at respective points of the illuminated surface 3 when the distance L is set at the same value as the focal length f of the spherical mirror 1. These declination angles $\alpha$ have been calculated with the off-axis angle $\theta$ assumed to be 15°.

TABLE 1

| Distance from Intersection C | Declination Angle |
| --- | --- |
| 0.4f | −0.57° |
| 0.3f | −0.25° |
| 0.2f | −0.01° |
| 0.1f | 0.09° |
| 0 | 0° |
| −0.1f | −0.35° |
| −0.2f | −1.03° |
| −0.3f | −2.12° |
| −0.4f | −3.68° |

Figure 6:
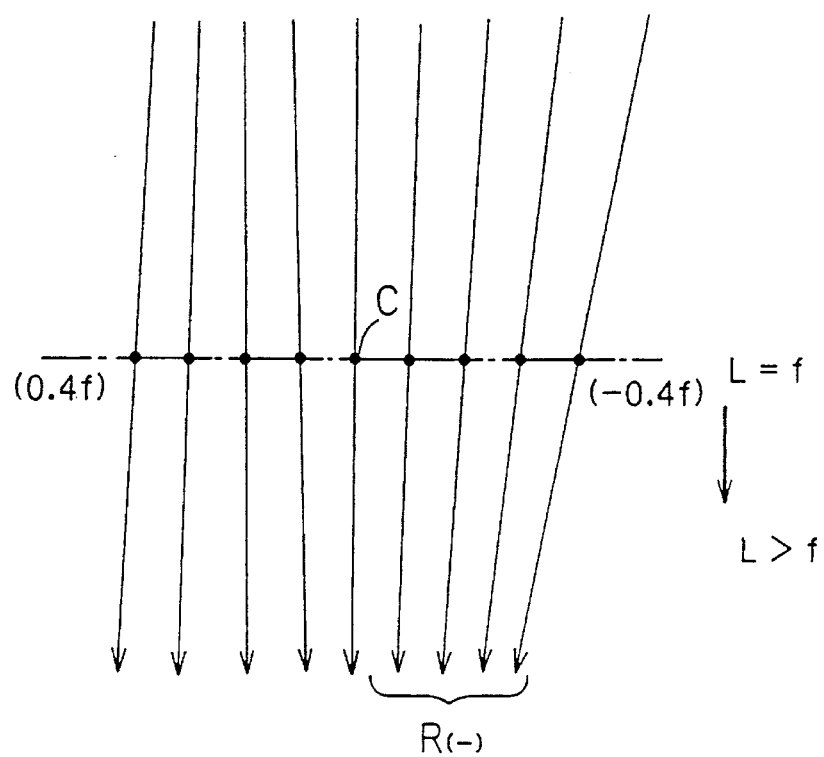
FIG. 6 illustrates the direction of rays of illuminating light.

The term "declination angle $\alpha$" indicates an angle between a normal line 3a of the illuminated surface 3 and a ray incident upon each point, as shown in FIG. 5. Positive value are measured toward the counterclockwise direction, negative value toward the clockwise direction. When the absolute value of the declination angle $\alpha$ is large, it means that rays of the illuminating light are incident upon the surface 3 with a low degree of parallelization. The conclusions can be drawn from Table 1: The declination angle $\alpha$ is significantly shifted in the minus direction (clockwise direction) in proportion to the distance from the optical axis when the distance from the intersection C is in a minus range. This means that minus-side light $R_{(-)}$ serves as focusing light within the illuminating light, as shown in FIG. 6. Furthermore, the absolute value of the declination angle α in the minus range is relatively larger than that in a plus range. Thus, it is understood that ray density on the minus side is increased as compared with that on the plus side as the illuminated surface 3 is separated from the spherical mirror 1. In other words, illuminance on the minus side is larger than that on the plus side. Consequently, the distribution center DC of the illuminance is shifted toward the plus side, as shown in FIG. 4.

Figure 7:
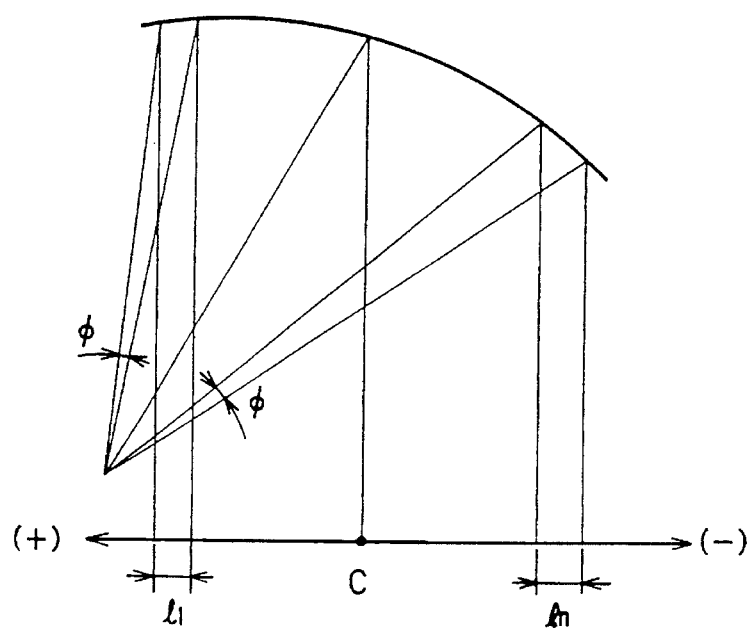
FIG. 7 illustrates geometric relation between a spherical mirror and illuminating light.

When the illuminated surface 3 is close to the spherical mirror 1, on the other hand, ray density on the plus side is increased as compared with that on the minus side, due to geometrical conditions. Assuming that rays with uniform intensity are emitted from the secondary light source 2 at a regular angle φ as shown in FIG. 7, the rays are reflected by the spherical mirror 1 and guided toward the illuminated surface 3 with substantially parallel relation. However, intervals $l_1$ and $l_n$ between the reflected rays neighboring each other are greater on the minus side as compared with the plus side. Thus, illuminance on the plus side is greater than that on the minus side. Consequently, the distribution center DC of the illuminance distribution is shifted toward the minus side, as shown in FIG. 2.

From the results shown in FIGS. 2 to 4 and the aforementioned consideration thereof, the following can be summarized: The distribution center DC of illuminance is varied with change in the distance L. The distribution center DC substantially coincides with the intersection C particularly when the distance L is set at the same value as the focal length f of the spherical mirror 1 (FIG. 3), so that the illuminance distribution is substantially symmetrical with respect to the optical axis of the illuminating system.

Quantitative consideration about symmetry of illuminance distribution will now be described, although the illuminance distribution has been qualitatively discussed hereinbefore. In order to quantitatively represent symmetry of illuminance distribution, symmetry is defined as a maximum difference evaluated in the following manner: Illuminance values, at respective points within the effective illuminated region of the illuminated surface 3, are evaluated through computer simulation. Then, illuminance $I_x$ at a certain point and illuminance $L_{-x}$ at a point symmetrical to said point with respect to the optical axis of the illuminating system are substituted in the following equation, to evaluate amounts of difference $DI_x$ at the respective points:

$$DI_x = \frac{|I_x - L_{-x}|}{I_0} \cdot 100 \qquad (1)$$

where $I_0$ represents illuminance at the intersection C (see FIG. 1). The maximum value of the amounts of difference $DI_x$ is defined as the amount of maximum difference so that the following discussion is made as to symmetry of illuminance distribution on the basis thereof.

The relationship, between the ratios (L/f) and (D/f) in the illumination system shown in FIG. 1, is obtained by the computer simulation under the following conditions:

(1) Light from the secondary light source 2 is incident upon the illuminated surface with uniform illuminance distribution if the collimator is of a transmission type which is symmetrical with respect to the optical axis; and (2) The off-axis angle θ is 15°.

The distance L, the focal length f and the dimension D are appropriately set, respectively, and then the computer calculates the illuminance of the surface 3 illuminated by the illumination system shown in FIG. 1. The term "dimension D" indicates a dimension of a side of the square effective illuminated region. Table 2 shows the results.

TABLE 2

| L/f | D/f | | | | | | | | | |
|---|---|---|---|---|---|---|---|---|---|---|
| | 0.1 | 0.2 | 0.3 | 0.4 | 0.5 | 0.6 | 0.7 | 0.8 | 0.9 | 1.0 |
| 1.9 | 6% | 12% | 19% | 29% | X | X | X | X | X | X |
| 1.8 | 5% | 11% | 18% | 25% | X | X | X | X | X | X |
| 1.7 | 5% | 9% | 15% | 22% | X | X | X | X | X | X |
| 1.6 | 41 | 8% | 13% | 18% | 25% | X | X | X | X | X |
| 1.5 | 3% | 6% | 10% | 15% | 20% | 27% | X | X | X | X |
| 1.4 | 3% | 5% | 9% | 12% | 16% | 21% | 27% | X | X | X |
| 1.3 | 21 | 4% | 6% | 9% | 12% | 15% | 19% | 24% | X | X |
| 1.2 | 1% | 3% | 4% | 6% | 8% | 10% | 12% | 15% | 17% | 19% |
| 1.1 | 1% | 1% | 2% | 3% | 4% | 5% | 6% | 7% | 7% | 5% |
| 1.0 | 0% | 0% | 0% | 0% | 0% | 0% | 0% | 1% | 3% | 6% |
| 0.9 | 0% | 1% | 1% | 2% | 3% | 4% | 6% | 8% | 12% | 17% |
| 0.8 | 1% | 2% | 3% | 5% | 6% | 8% | 11% | 15% | 20% | 26% |
| 0.7 | 1% | 3% | 5% | 7% | 9% | 12% | 16% | 21% | 27% | X |
| 0.6 | 2% | 4% | 7% | 10% | 12% | 17% | 21% | 27% | X | X |
| 0.5 | 3% | 6% | 9% | 12% | 16% | 20% | 26% | X | X | X |
| 0.4 | 3 | 7% | 10% | 14% | 19% | 24% | X | X | X | X |
| 0.3 | 4% | 8% | 12% | 17% | 22% | 27% | X | X | X | X |
| 0.2 | 4% | 9% | 14% | 19% | 24% | X | X | X | X | X |
| 0.1 | 5% | 10% | 15% | 20% | 28% | X | X | X | X | X |

Referring to each of Table 2 and the following Tables 4, 8 to 10 and 13 to 16, the mark "X" indicates that the amount of maximum difference is in excess of 30%.

In the case of applying the aforementioned illumination system to an exposure apparatus, it is desirable to determine the relation between the distance L, the focal length f and the dimension D so that the amount of maximum difference is not more than 7%, in view of symmetry. Table 3 shows boundary conditions satisfying such condition (≦7%), which are derived from the results in Table 2.

TABLE 3

| D/f | Range of Distance L |
|---|---|
| 0.2 | 0.572f ≤ L ≤ 1.428f |
| 0.25 | 0.624f ≤ L ≤ 1.376f |
| 0.3 | 0.672f ≤ L ≤ 1.328f |
| 0.35 | 0.717f ≤ L ≤ 1.283f |
| 0.4 | 0.759f ≤ L ≤ 1.241f |
| 0.45 | 0.798f ≤ L ≤ 1.202f |
| 0.5 | 0.833f ≤ L ≤ 1.167f |
| 0.55 | 0.865f ≤ L ≤ 1.135f |
| 0.6 | 0.885f ≤ L ≤ 1.115f |
| 0.65 | 0.897f ≤ L ≤ 1.103f |
| 0.7 | 0.912f ≤ L ≤ 1.088f |
| 0.75 | 0.930f ≤ L ≤ 1.070f |
| 0.8 | 0.949f ≤ L ≤ 1.051f |

Figure 8:
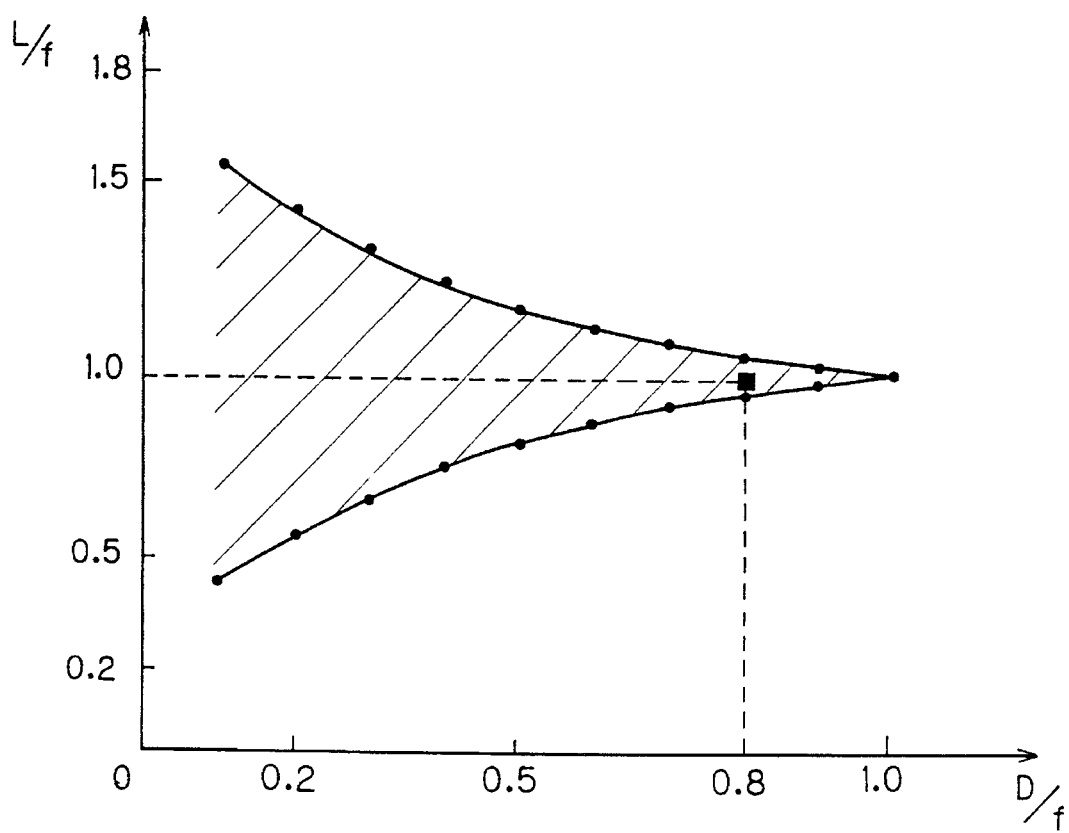
FIG. 8 illustrates boundary conditions when an upper limit of the amount of maximum difference is set at 7%.

FIG. 8 illustrates the boundary conditions, also. Referring to FIG. 8, the horizontal line represents ratio (D/f) and the vertical line represents the ratio (L/f). A region shown with oblique lines represents a range satisfying the aforementioned boundary conditions.

From Table 3 and FIG. 8, the boundary conditions are represented by the following inequality:

$$f\{1-K(1-(D/f)^2)\} \leq L \leq f\{1+K(1-(D/f)^2)\} \quad (2)$$

where f: focal length of the spherical mirror 1

D: dimension of a side of the square effective illuminated region

L: distance between the spherical mirror 1 and the illuminated surface 3

K = 0.67 (when 0.58 > (D/f))

K = $2(D/f)^2$ (when 0.58 ≤ (D/f))

Thus, when the illumination system satisfies the inequality (2), the amount of maximum difference is not more than 7% and illuminance distribution on the effective illuminated region of the illuminated surface 3 is in excellent symmetry. When the illumination system does not satisfy the inequality (2), on the other hand, the amount of maximum difference exceeds 7% and illuminance distribution thereon is asymmetrical. Although the upper limit of the amount of maximum difference of the above illumination system is set at 7%, it is possible also to illuminate the surface 3 with symmetrical illuminance distribution with respect to the optical axis of the illuminating system when the upper limit thereof is set at another value. In this case, boundary conditions corresponding to the above value can be evaluated similarly to the above case. Further the distance L, the focal length f and the dimension D of the illumination system can be set so as to satisfy the boundary conditions, respectively.

While the reflecting optical element is the spherical mirror 1 in the above system, a parabolic mirror may be employed in place of the spherical mirror to attain a similar effect.

Figure 9A:
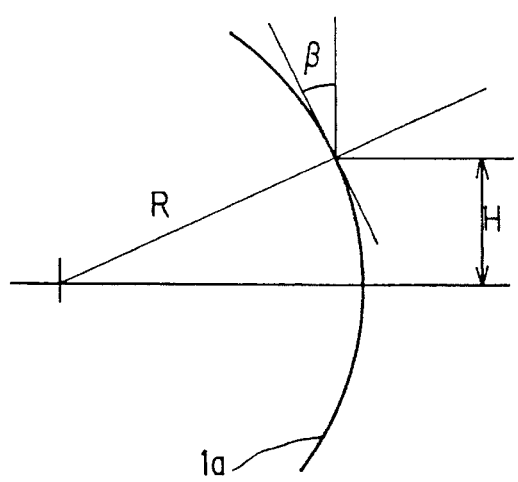
FIGS. 9A and 9B are partially sectional views of a spherical mirror and a Fresnel mirror, respectively.
Figure 9B:
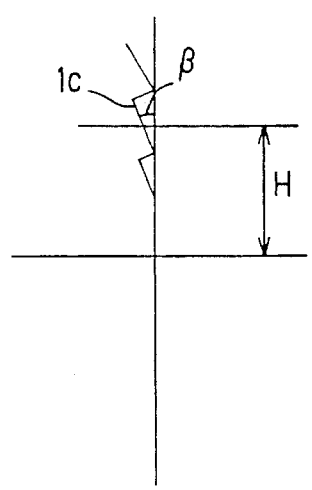

Alternatively, a Fresnel mirror may be employed in place of the spherical mirror 1. The Fresnel mirror is provided with a plurality of fine reflecting surfaces 1c (FIG. 9B) arranged on a flat surface. Each of the surfaces 1c is tilted by an angle responsive to a fine region of a continuous curved surface 1a (FIG. 9A). Therefore, the Fresnel mirror reflects incident light at a point which is different from that of a spherical or parabolic mirror having a continuous curved surface.

Figure 12:
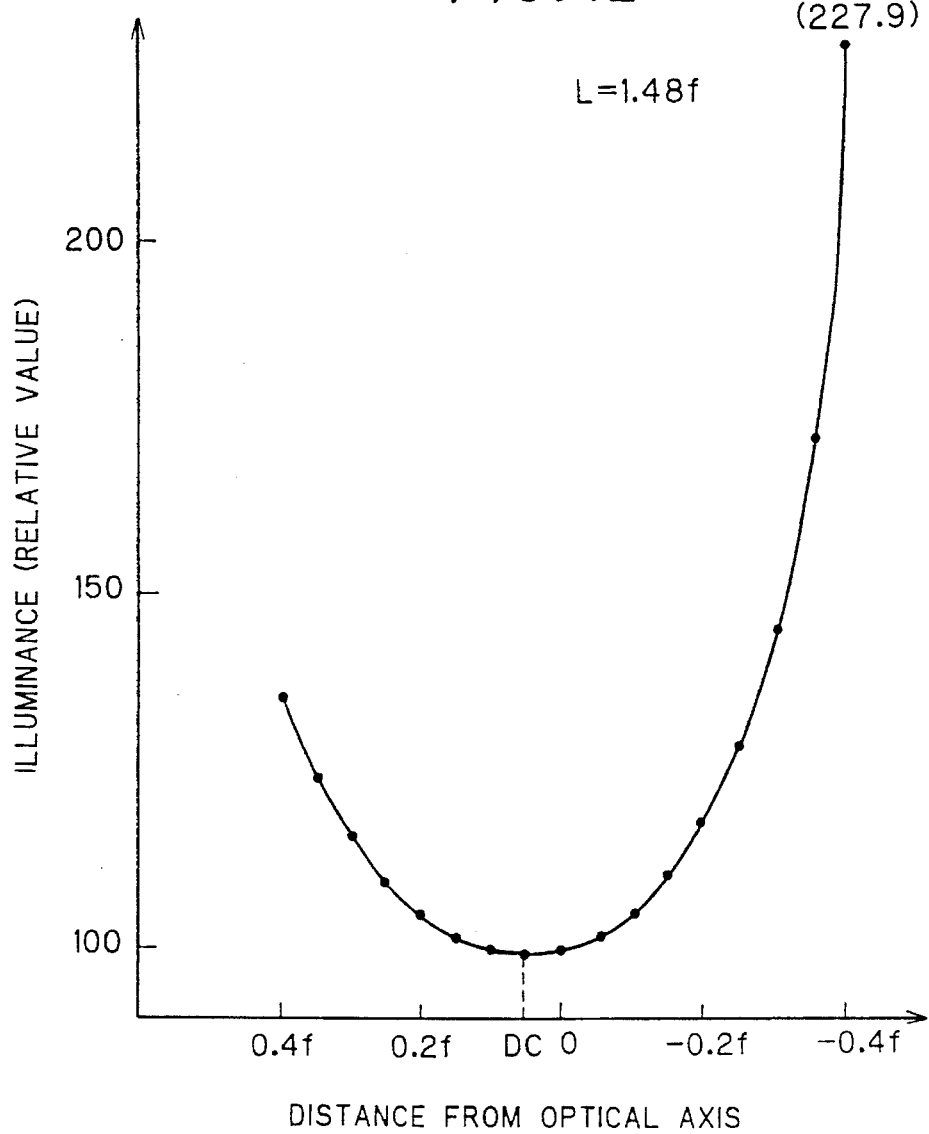
FIGS. 10 to 12 are graphs showing illuminance distribution on an illuminated surface when a reflecting optical element is formed by a Fresnel mirror.
Figure 10:
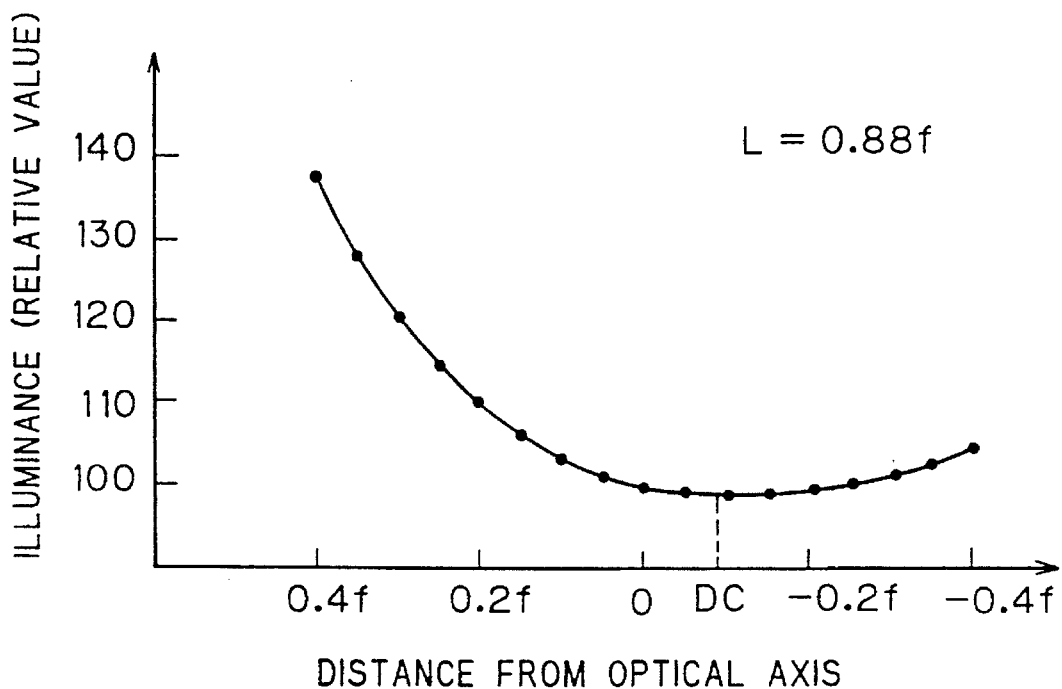
Figure 11:
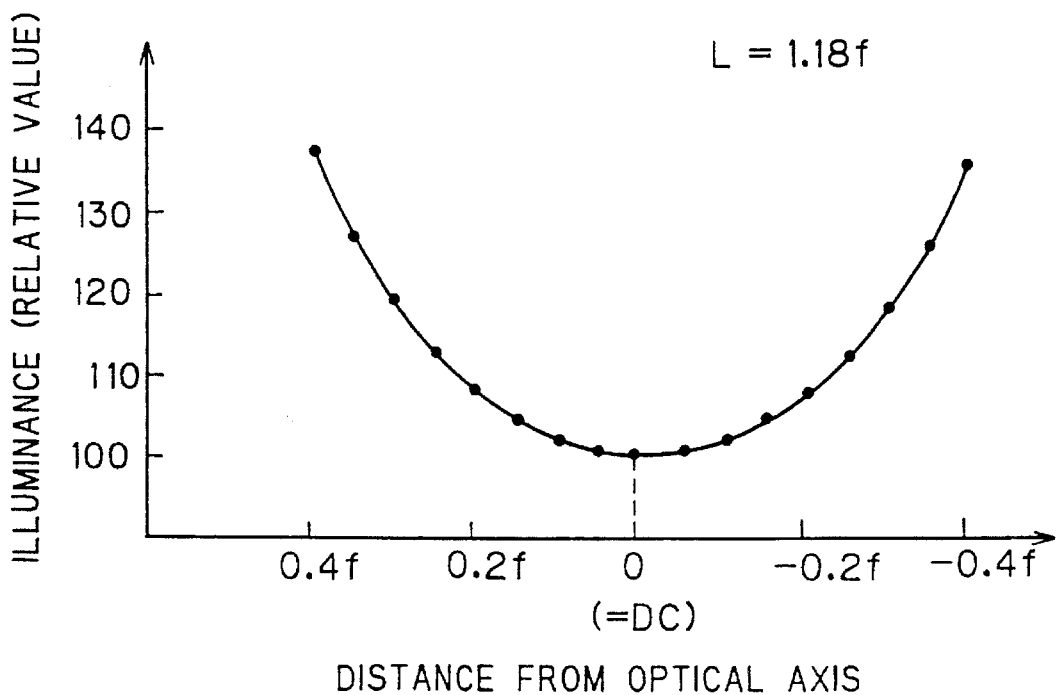

Accordingly, the above analysis for the illumination system including the spherical mirror 1 can not applied to an illumination system including the Fresnel mirror. Hence it is necessary to obtain relationship between a distance L from a focal length f of the Fresnel mirror to an illuminated surface and illuminance distribution on an effective illuminated region of the illuminated surface 3, similarly to the above. FIGS. 10 to 12 illustrate the results thereof. FIG. 10 shows illuminance distribution on the effective illuminated region of the illuminated surface in relation to the distance L set at 0.88 times the focal length f of the Fresnel mirror. FIG. 11 shows illuminance distribution thereon in relation to the distance L set at 1.18 times the focal length f of the Fresnel mirror. FIG. 12 shows illuminance distribution thereon in relation to the distance L set at 1.48 times the focal length f of the Fresnel mirror. As will be understood from FIG. 11, a distribution center DC of illuminance substantially coincides with a intersection C when the distance L is set at 1.18 times the focal length f of the Fresnel mirror. Thus, the illuminance distribution is substantially symmetrical with respect to the optical axis of the illuminating system. Further, the following conclusion can be drawn from FIGS. 10 to 12: The distribution center DC of illuminance is shifted from a minus side toward the intersection C as the distance L is increased. The illuminance distribution is substantially symmetrical with respect to the intersection C at a prescribed position (L= 1.18 f) and shifted toward the plus side as the distance L is further increased.

Quantitative consideration regarding symmetry of the illuminance distribution will now be described. Table 4 shows quantities of maximum difference in relation between ratios (L/f) and (D/f). The amounts of maximum difference are calculated by computer simulation.

TABLE 4

| | D/f | | | | | | | | | |
|---|---|---|---|---|---|---|---|---|---|---|
| L/f | 0.1 | 0.2 | 0.3 | 0.4 | 0.5 | 0.6 | 0.7 | 0.8 | 0.9 | 1.0 |
| 2.08 | 7% | 16% | 29% | X | X | X | X | X | X | X |
| 1.98 | 7% | 15% | 26% | X | X | X | X | X | X | X |
| 1.88 | 6% | 13% | 22% | X | X | X | X | X | X | X |
| 1.78 | 5% | 11% | 18% | 29% | X | X | X | X | X | X |
| 1.68 | 4% | 9% | 15% | 23% | X | X | X | X | X | X |
| 1.58 | 3% | 7% | 11% | 18% | 27% | X | X | X | X | X |
| 1.48 | 21 | 5% | 8% | 13% | 19% | 29% | X | X | X | X |
| 1.38 | 2% | 3% | 5% | 8% | 12% | 17% | 26% | X | X | X |
| 1.28 | 1% | 2% | 3% | 4% | 6% | 8% | 11% | 16% | 28% | X |
| 1.18 | 0% | 0% | 0% | 0% | 0% | 0% | 1% | 2% | 3% | 2% |
| 1.08 | 1% | 2% | 2% | 4% | 5% | 7% | 11% | 15% | 22% | X |
| 0.98 | 1% | 3% | 5% | 7% | 10% | 14% | 19% | 26% | X | X |
| 0.88 | 2% | 4% | 7% | 10% | 14% | 19% | 25% | X | X | X |
| 0.78 | 3% | 6% | 9% | 14% | 18% | 24% | X | X | X | X |

TABLE 4-continued

| L/f | D/f | | | | | | | | | |
|---|---|---|---|---|---|---|---|---|---|---|
| | 0.1 | 0.2 | 0.3 | 0.4 | 0.5 | 0.6 | 0.7 | 0.8 | 0.9 | 1.0 |
| 0.68 | 4% | 8% | 12% | 17% | 22% | 28% | X | X | X | X |
| 0.58 | 4% | 9% | 14% | 19% | 25% | X | X | X | X | X |
| 0.48 | 5% | 10% | 16% | 22% | 28% | X | X | X | X | X |
| 0.38 | 6% | 11% | 18% | 24% | X | X | X | X | X | X |
| 0.28 | 6% | 13% | 20% | 27% | X | X | X | X | X | X |

Table 5 shows boundary conditions satisfying the condition that the upper limit of the amount of maximum difference is 10%, which are derived from the results in Table 4.

TABLE 5

| D/f | Range of Distance L |
|---|---|
| 0.2 | 0.675f ≦ L ≦ 1.685f |
| 0.25 | 0.736f ≦ L ≦ 1.624f |
| 0.3 | 0.793f ≦ L ≦ 1.567f |
| 0.35 | 0.846f ≦ L ≦ 1.514f |
| 0.4 | 0.896f ≦ L ≦ 1.464f |
| 0.45 | 0.941f ≦ L ≦ 1.419f |
| 0.5 | 0.983f ≦ L ≦ 1.377f |
| 0.55 | 1.021f ≦ L ≦ 1.339f |
| 0.6 | 1.045f ≦ L ≦ 1.315f |
| 0.65 | 1.059f ≦ L ≦ 1.301f |
| 0.7 | 1.077f ≦ L ≦ 1.283f |
| 0.75 | 1.098f ≦ L ≦ 1.262f |
| 0.8 | 1.120f ≦ L ≦ 1.240f |

Figure 13:
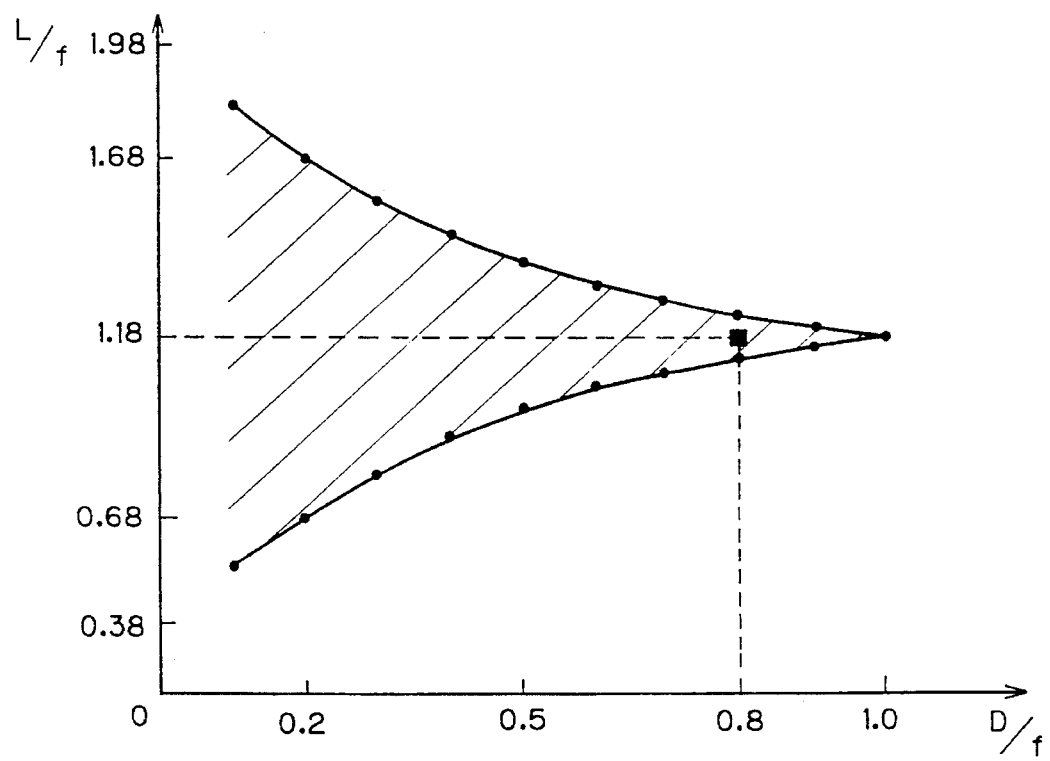
FIG. 13 illustrates boundary conditions when an upper limit of the amount of maximum difference is set at 10%.

FIG. 13 illustrates the boundary conditions shown in Table 5, also. From Table 5 and FIG. 13, the boundary conditions are represented in the following inequality:

$$1.18 f\{1-K(1-(D/f)^2)\} \leq L \leq 1.18 f\{1+K(1-(D/f)^2)\} \quad (3)$$

where f: focal length of the Fresnel mirror

D: dimension of a side of the square effective illuminated region

L: distance between the Fresnel mirror and the illuminated surface

K= 0.67 (when 0.58> (D/f))

K= $2(D/f)^2$ (when 0.58≦(D/f))

Thus, when the illumination system satisfies the inequality (3), the amount of maximum difference is not more than 10% and illuminance distribution on the effective illuminated region is in excellent symmetry. When the illumination system does not satisfy the inequality (3), on the other hand, the amount of maximum difference exceeds 10% and illuminance distribution thereon is asymmetrical. Although the upper limit of the amount of maximum difference of the above illumination system is set at 10%, it is possible also to illuminate the surface with symmetrical illuminance distribution with respect to the optical axis of the illuminating system when the upper limit thereof is set at another value. In this case, boundary conditions corresponding to the above can be evaluated similarly to the above case. Further the distance L, the focal length f and the dimension D of the illumination system can be set so as to satisfy the boundary conditions, respectively.

B. First Embodiment

Figure 14:
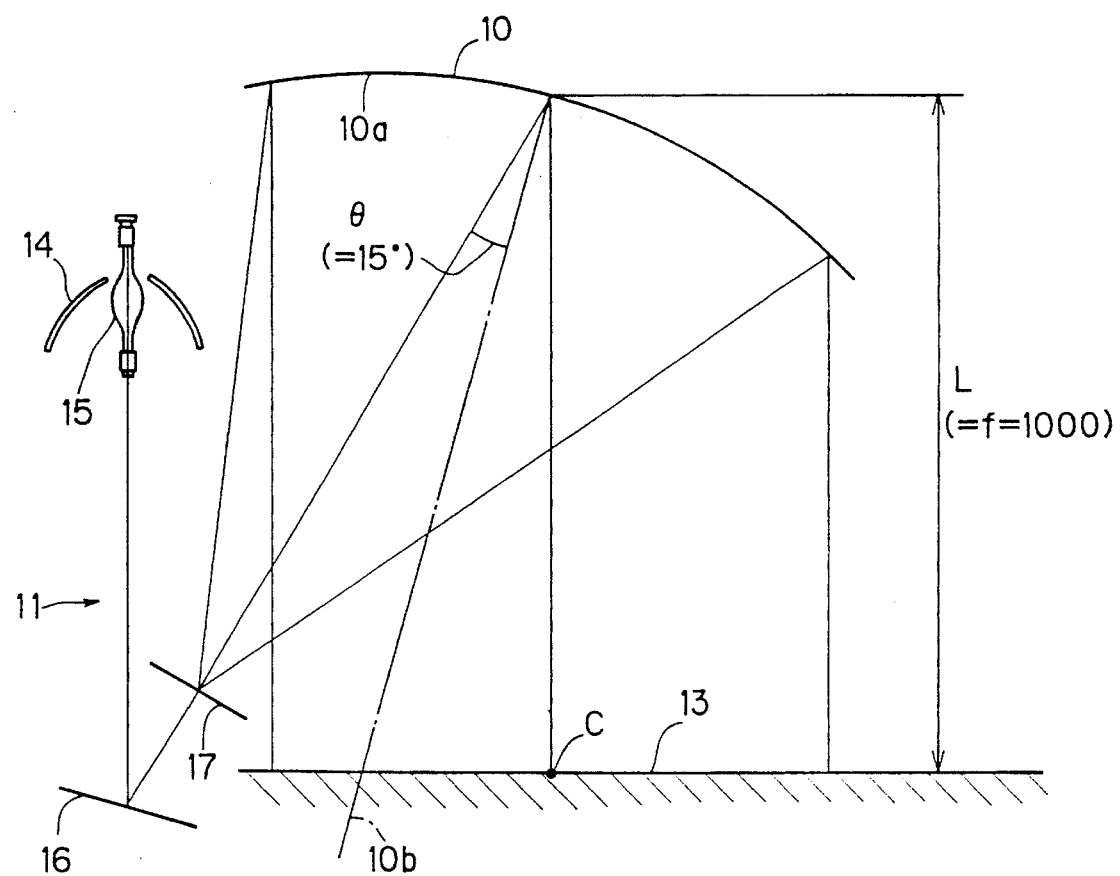
FIG. 14 illustrates a first embodiment of an illumination system according to the present invention.

FIG. 14 is a block diagram showing a first embodiment of an illumination system according to the present invention. As shown in FIG. 14, the illumination system includes a spherical mirror 10 with a focal length f of 1000 and a light source 11. The light source 11 is formed by an elliptic mirror 14, a mercury lamp 15, a mirror 16 and a fly-eye lens 17. Light from the mercury lamp 15 is reflected by the mirror 16 and then converged onto the fly-eye lens 17. The fly-eye lens 17 has a characteristic that the tangent of an outgoing angle from the lens 17 is proportionate to that of an incident angle upon the lens, which is disclosed in Japanese Patent Laying-Open Gazette No. 178207 entitled "Optical System for Lighting". Therefore, uniform illuminance distribution is attained on an illuminated surface so far as a collimator is of a transmission type having axial symmetry. The fly-eye lens 17, which functions as a secondary light source, is arranged at a point which is close to the focal point of the spherical mirror 10 and is deviated from a principal axis 10b of the spherical mirror 10. Illuminating light from the fly-eye lens 17 is reflected by a reflecting surface 10a of the spherical mirror 10, and applied onto an illuminated surface 13. An 800×800 effective illuminated region of the illuminated surface 13 is illuminated by the illumination system shown in FIG. 14. Hence, a dimension D of a side of the square effective illuminated region is of 800. As will be understood from FIG. 14, an off-axis angle θ of the spherical mirror 10 is set at 15°. A distance L between the spherical mirror 10 and the illuminated surface 13 is set at the same value as the focal length f (=1000) of the spherical mirror 10. The light source 11 is not restricted to the above structure, but may have any structure.

Thus, the illumination system shown in FIG. 14 satisfies the following equations:

$$D/f = 800/1000 = 0.8$$

$$L = f.$$

Hence L/f= 1. Therefore, a point (denoted by the mark ■) may be plotted in the oblique line region, as shown in FIG. 8, and hence it is predicted that the amount of maximum difference is not more than 7%.

In order to verify this, illuminance levels on respective points on the effective illuminated region are calculated in relation to the above setting (D= 800, L= f= 1000). Table 6 shows the results.

TABLE 6

| Y\X | 0 | 100 | 200 | 300 | 400 |
|---|---|---|---|---|---|
| 400 | 127 | 129 | 135 | 145 | 161 |
| 300 | 114 | 116 | 121 | 131 | 145 |
| 200 | 106 | 107 | 112 | 121 | 134 |
| 100 | 101 | 103 | 107 | 115 | 128 |
| 0 | 100 | 101 | 106 | 114 | 126 |
| −100 | 102 | 103 | 108 | 116 | 128 |
| −200 | 106 | 108 | 113 | 121 | 134 |
| −300 | 115 | 116 | 121 | 130 | 144 |
| −400 | 126 | 128 | 183 | 143 | 159 |

Referring to Table 6, symbol Y represents a distance from a intersection C (see FIG. 14) at which the optical axis of the

11 illuminating system crosses the illuminated surface 13. Positive value are measure to the left with respect to the intersection C, negative value to the right. Symbol X represents a distance from the intersection C on this side of the figure. Illuminance on each point on the illuminated surface 13 is shown in relation to illuminance of 100 at the intersection C (0, 0).

As will be understood from Table 6, the illuminance levels at each point on the effective illuminated region are substantially symmetrical with respect to the intersection C. Noting points (0, −400) and (0, 400), for example, the illuminance levels on these points are 126 and 127, respectively. Hence, an amount of difference $DI_X$ is evaluated on the basis of the equation (1) as follows:

$$DI_X = \frac{|126 - 127|}{100} \cdot 100 = 1 \ (\%)$$

The amounts of difference $DI_X$ on the respective points of the illuminated surface 13 are evaluated, similarly to the above. The maximum value of the amounts of difference $DI_X$ thereby obtained was 2%. Thus the illuminated surface 13 can be illuminated with an illuminance distribution having excellent symmetry.

And hence, it is possible to uniformly illuminate the surface 13 by adding appropriate means to the above illumination system. For example, characteristics for correcting the distribution levels shown in Table 6 may be added to respective lenses forming the fly-eye lens 17.

C. Second Embodiment

Figure 15:
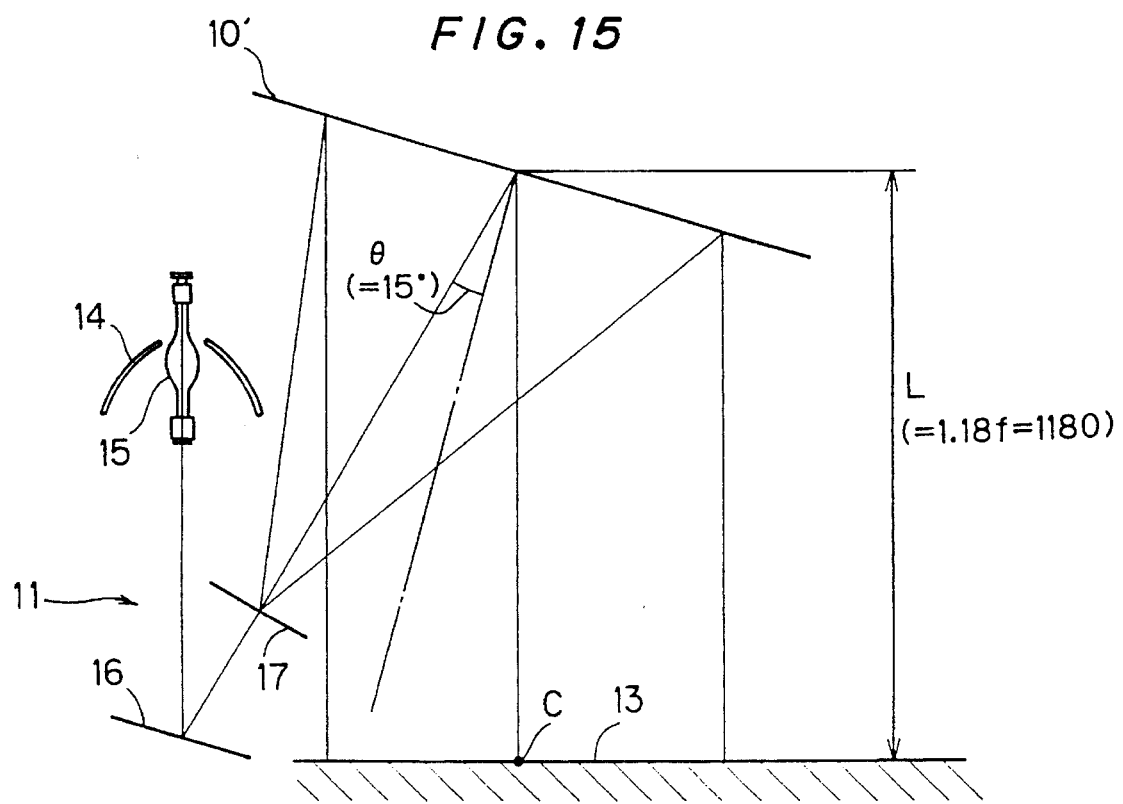
FIG. 15 illustrates a second embodiment of an illumination system according to the present invention.

FIG. 15 is a block diagram showing a second embodiment of an illumination system according to the present invention. As shown in FIG. 15, the illumination system is includes a Fresnel mirror 10' with focal length f of 1000 and a light source 11. The light source 11 is identical in structure to the light source 11 shown in FIG. 14. As will be understood from FIG. 15 in comparison with FIG. 14, the illumination system of the second embodiment is identical to that of the first embodiment, except for a distance L between the Fresnel mirror 10' and an illuminated surface 13. The distance L is set at 1.18 times a focal length f of the Fresnel mirror 10'.

Thus, the illumination system shown in FIG. 15 satisfies the following equations:

D/f = 0.8

L = 1.18 f.

Hence L/f = 1.18. Therefore, a point (denoted by the mark ■) may be plotted in the oblique line region, as shown in FIG. 13, and hence it is predicted that the amount of maximum difference is not more then 10%.

In order to verify this, illuminance levels on respective points of the illuminated surface 13 are calculated in relation to the above setting (D= 800, L=1180 and f= 1000). Table 7 shows the results.

TABLE 7

| Y\X | 0 | 100 | 200 | 300 | 400 |
|---|---|---|---|---|---|
| 400 | 137 | 139 | 148 | 166 | 200 |
| 300 | 118 | 120 | 127 | 141 | 165 |
| 200 | 107 | 109 | 115 | 126 | 146 |
| 100 | 102 | 103 | 109 | 119 | 137 |
| 0 | 100 | 102 | 107 | 117 | 135 |

TABLE 7-continued

| Y\X | 0 | 100 | 200 | 300 | 400 |
|---|---|---|---|---|---|
| −100 | 102 | 104 | 109 | 119 | 137 |
| −200 | 108 | 109 | 115 | 127 | 147 |
| −300 | 118 | 120 | 127 | 141 | 167 |
| −400 | 135 | 138 | 147 | 167 | 202 |

As understood from Table 7, the illuminance levels on an effective illuminated region of the illuminated surface 13 are substantially symmetrical with respect to a intersection C (0, 0). Noting points (0, −400) and (0, 400), for example, the illuminance levels at these points are 135 and 137, respectively. Hence, an amount of difference $DI_X$ evaluated on the basis of the equation (1) is as follows:

$$DI_X = \frac{|135 - 137|}{100} \cdot 100 = 2 \ (\%)$$

Similarly, the amounts of difference $DI_X$ on the respective points of the illuminated surface 13 are evaluated. The maximum value of the amounts of difference $DI_X$ obtained is 2%. Thus, the illuminated surface 13 can be illuminated with illuminance distribution having excellent symmetry.

Since illuminance distribution is symmetrical with respect to the optical axis of the illuminating system, it is possible to uniformly illuminate the illuminated surface 13 in a similar manner to the first embodiment.

D. Third Embodiment

Figure 16:
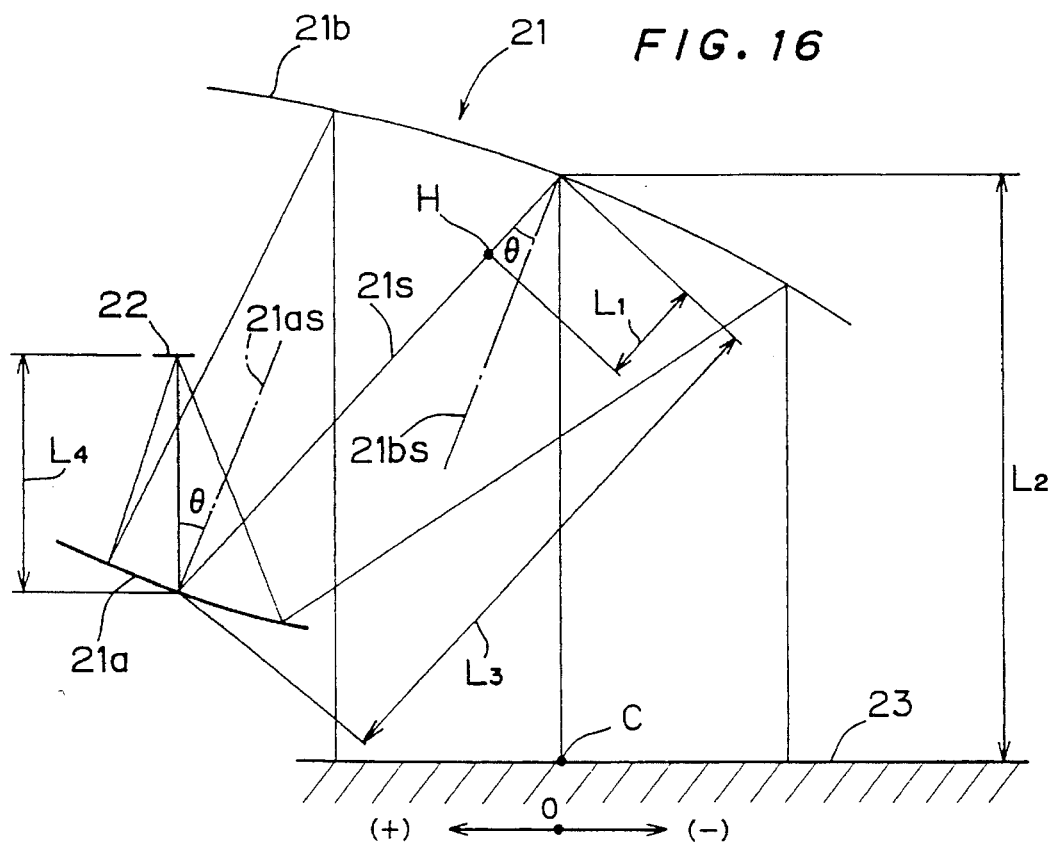
FIG. 16 illustrates a third embodiment of an illumination system according to the present invention.

FIG. 16 is a block diagram showing a third embodiment of an illumination system according to the present invention. The illumination system is optically equivalent in structure to the illumination system shown in FIG. 1. As shown in FIG. 16, the illumination system includes a reflecting optical unit 21 and a light source (secondary light source) 22. The reflecting optical unit 21 is formed by spherical mirrors 21a and 21b having principal axes 21as and 21bs shifted from each other. The light source 22 is located in proximity onto a focal point of the reflecting optical unit 21. The respective principal axes 21as and 21bs of the spherical mirrors 21a and 21b are at a predetermined angle, i.e., off-axis angles θ with an optical axis 21s of the reflecting optical unit 21. Thus, illuminating light from the light source 22 is successively reflected by the reflecting mirrors 21a and 21b. Light with parallel rays is then incident upon an illuminated surface 23.

Further, a front principal point H of the reflecting optical unit 21 is located between the mirrors 21a, 21b. Since the illumination systems shown in FIGS. 1 and 16 are optically equivalent to each other, the following relation holds:

$L = L_1 + L_2$ where L is the distance between the spherical mirror 1 and the illuminated surface 3 shown in FIG. 1, $L_1$ is a distance between the front principal point H and the spherical mirror 21b, and $L_2$ is a distance between the spherical mirror 21b and the illuminated surface 23. As understood from the above equation, the value of the distance $L_2$, being a factor for determining the size of the illumination system according to the third embodiment, is smaller by the distance $L_1$ than those (distances L) of the first and second embodiments. Therefore, the size of the illumination system can be reduced. Consequently, the size of an exposure apparatus etc. applicable to the illumination system can be reduced, also.

Although the reflecting optical unit 21 is formed by two spherical mirrors 21a and 21b in the third embodiment, the same may also be formed by three or more spherical mirrors.

Alternatively, parabolic mirrors or Fresnel mirrors may be employed in place of the spherical mirrors.

Symmetry of illuminance distribution on the illuminated surface 23 will now be quantitatively described. The relationship between ratios (L/f) and (D/f) in the illumination system shown in FIG. 16 is obtained by computer simulation under the following conditions:

(1) The light source 22 emits light with uniform illuminance distribution on the illuminated surface if the collimator is of a transmission type which was symmetrical to the optical axis;

(2) The off-axis angle $\theta$ is 15°;

(3) The focal length f of the reflecting optical unit 21 is 1000;

(4) The radii of curvature of the spherical mirrors 21a and 21b are −3733.333 and −2461.538, respectively;

(5) The distance $L_3$ between the spherical mirrors 21a and 21b is 800;

(6) The distance $L_1$ between the front principal point H and the spherical mirror 21b is 150; and (7) The distance $L_4$ between the light source 22 and the spherical mirror 21 is 350.

In other words, the computer calculates the amounts of maximum difference in relation therebetween. Table 8 shows the results.

(4) The radii of curvature of the spherical mirrors 21a and 21b are −1100 and −2444.444, respectively;

(5) The distance $L_3$ between the spherical mirrors 21a and 21b is 1100;

(6) The distance $L_1$ between the front principal point H and the spherical mirror 21b is 200; and (7) The distance $L_4$ between the light source 22 and the spherical mirror 21a is 100.

Table 9 shows the results.

TABLE 8

| L/f | D/f | | | | | | | | | |
|---|---|---|---|---|---|---|---|---|---|---|
| | 0.1 | 0.2 | 0.3 | 0.4 | 0.5 | 0.6 | 0.7 | 0.8 | 0.9 | 1.0 |
| 1.9 | 4% | 8% | 14% | 20% | 28% | X | X | X | X | X |
| 1.8 | 4% | 7% | 12% | 17% | 25% | X | X | X | X | X |
| 1.7 | 3% | 6% | 10% | 15% | 21% | 29% | X | X | X | X |
| 1.6 | 3% | 5% | 9% | 12% | 17% | 24% | X | X | X | X |
| 1.5 | 2% | 4% | 7% | 10% | 14% | 19% | 27% | X | X | X |
| 1.4 | 2% | 3% | 5% | 8% | 11% | 15% | 20% | 28% | X | X |
| 1.3 | 1% | 2% | 4% | 6% | 8% | 11% | 15% | 20% | 28% | X |
| 1.2 | 1% | 1% | 2% | 3% | 5% | 7% | 9% | 13% | 18% | 26% |
| 1.1 | 0% | 1% | 1% | 1% | 2% | 3% | 4% | 6% | 9% | 14% |
| 1.0 | 0% | 0% | 1% | 1% | 1% | 1% | 1% | 0% | 1% | 3% |
| 0.9 | 1% | 1% | 2% | 3% | 3% | 4% | 5% | 6% | 7% | 7% |
| 0.8 | 1% | 2% | 3% | 5% | 6% | 8% | 9% | 11% | 14% | 16% |
| 0.7 | 2% | 3% | 5% | 7% | 9% | 11% | 14% | 17% | 20% | 25% |
| 0.6 | 2% | 4% | 6% | 9% | 11% | 14% | 18% | 22% | 26% | X |
| 0.5 | 2% | 5% | 8% | 10% | 14% | 17% | 21% | 26% | X | X |
| 0.4 | 3% | 6% | 9% | 12% | 16% | 20% | 25% | X | X | X |
| 0.3 | 3% | 7% | 10% | 14% | 18% | 23% | 29% | X | X | X |
| 0.2 | 4% | 7% | 11% | 16% | 21% | 26% | X | X | X | X |
| 0.1 | | | | | | | | | | |

In a similar manner, the amounts of maximum difference in relation between the ratios (L/f) and (D/f) under are evaluated the following conditions in addition to the above conditions (1) to (3):

TABLE 9

| L/f | D/f | | | | | | | | | |
|---|---|---|---|---|---|---|---|---|---|---|
| | 0.1 | 0.2 | 0.3 | 0.4 | 0.5 | 0.6 | 0.7 | 0.8 | 0.9 | 1.0 |
| 1.9 | 4% | 7% | 12% | 17% | 24% | X | X | X | X | X |
| 1.8 | 3% | 6% | 10% | 15% | 21% | 29% | X | X | X | X |
| 1.7 | 3% | 6% | 9% | 13% | 18% | 25% | X | X | X | X |
| 1.6 | 2% | 5% | 7% | 11% | 15% | 21% | 29% | X | X | X |
| 1.5 | 2% | 4% | 6% | 9% | 12% | 17% | 23% | X | X | X |
| 1.4 | 1% | 3% | 5% | 7% | 9% | 13% | 18% | 25% | X | X |
| 1.3 | 1% | 2% | 3% | 5% | 7% | 9% | 13% | 19% | 27% | X |

TABLE 9-continued

| L/f | D/f | | | | | | | | | |
|-----|-----|-----|-----|-----|-----|-----|-----|-----|-----|-----|
|     | 0.1 | 0.2 | 0.3 | 0.4 | 0.5 | 0.6 | 0.7 | 0.8 | 0.9 | 1.0 |
| 1.2 | 1%  | 1%  | 2%  | 3%  | 4%  | 6%  | 9%  | 13% | 19% | 28% |
| 1.1 | 0%  | 0%  | 1%  | 1%  | 2%  | 3%  | 4%  | 7%  | 11% | 18% |
| 1.0 | 0%  | 1%  | 1%  | 1%  | 1%  | 1%  | 0%  | 1%  | 4%  | 8%  |
| 0.9 | 1%  | 1%  | 2%  | 3%  | 3%  | 4%  | 4%  | 4%  | 3%  | 1%  |
| 0.8 | 1%  | 2%  | 3%  | 4%  | 6%  | 7%  | 8%  | 9%  | 10% | 10% |
| 0.7 | 1%  | 3%  | 4%  | 6%  | 8%  | 10% | 12% | 14% | 16% | 17% |
| 0.6 | 2%  | 4%  | 6%  | 8%  | 10% | 13% | 15% | 18% | 21% | 25% |
| 0.5 | 2%  | 5%  | 7%  | 9%  | 12% | 15% | 19% | 23% | 27% | X   |
| 0.4 | 3%  | 5%  | 8%  | 11% | 14% | 18% | 22% | 27% | X   | X   |
| 0.3 | 3%  | 6%  | 9%  | 13% | 17% | 21% | 26% | X   | X   | X   |
| 0.2 |     |     |     |     |     |     |     |     |     |     |
| 0.1 |     |     |     |     |     |     |     |     |     |     |

Similarly to the above, the amounts of maximum difference in relation between the ratios (L/f) and (D/f) are evaluated under the following conditions in addition to the above conditions (1) to (3):

(4) The radii of curvature of the spherical mirrors 21a and 21b are −3600 and −2250, respectively;

(5) The distance $L_3$ between the spherical mirrors 21a and 21b is 900;

(6) The distance $L_1$ between the front principal point H and the spherical mirror 21b is 100; and (7) The distance $L_4$ between the light source 22 and the spherical mirror 21a is 200.

Table 10 shows the results.

TABLE 10

| L/f | D/f | | | | | | | | | |
|-----|-----|-----|-----|-----|-----|-----|-----|-----|-----|-----|
|     | 0.1 | 0.2 | 0.3 | 0.4 | 0.5 | 0.6 | 0.7 | 0.8 | 0.9 | 1.0 |
| 1.9 | 4%  | 9%  | 15% | 21% | X   | X   | X   | X   | X   | X   |
| 1.8 | 4%  | 8%  | 13% | 19% | 26% | X   | X   | X   | X   | X   |
| 1.7 | 3%  | 7%  | 11% | 16% | 22% | X   | X   | X   | X   | X   |
| 1.6 | 3%  | 6%  | 9%  | 13% | 18% | 25% | X   | X   | X   | X   |
| 1.5 | 2%  | 5%  | 7%  | 11% | 15% | 20% | 27% | X   | X   | X   |
| 1.4 | 2%  | 4%  | 6%  | 8%  | 11% | 15% | 20% | 27% | X   | X   |
| 1.3 | 1%  | 3%  | 4%  | 6%  | 8%  | 11% | 14% | 19% | 25% | X   |
| 1.2 | 1%  | 2%  | 3%  | 4%  | 5%  | 7%  | 9%  | 12% | 15% | 21% |
| 1.1 | 0%  | 1%  | 1%  | 1%  | 2%  | 3%  | 4%  | 5%  | 6%  | 9%  |
| 1.0 | 0%  | 0%  | 1%  | 1%  | 1%  | 1%  | 1%  | 2%  | 2%  | 2%  |
| 0.9 | 1%  | 1%  | 2%  | 3%  | 4%  | 5%  | 6%  | 8%  | 9%  | 11% |
| 0.8 | 1%  | 2%  | 4%  | 5%  | 7%  | 8%  | 11% | 13% | 16% | 20% |
| 0.7 | 2%  | 3%  | 5%  | 7%  | 9%  | 12% | 15% | 19% | 23% | 28% |
| 0.6 | 2%  | 4%  | 7%  | 9%  | 12% | 15% | 19% | 24% | 29% | X   |
| 0.5 | 3%  | 5%  | 8%  | 11% | 15% | 18% | 23% | 29% | X   | X   |
| 0.4 | 3%  | 6%  | 9%  | 13% | 17% | 22% | 27% | X   | X   | X   |
| 0.3 | 3%  | 7%  | 11% | 15% | 19% | 25% | X   | X   | X   | X   |
| 0.2 | 4%  | 8%  | 12% | 17% | 22% | 28% | X   | X   | X   | X   |
| 0.1 |     |     |     |     |     |     |     |     |     |     |

In the case of applying the above illumination system to an exposure apparatus, it is preferable to set the relation between the distance L (= $L_1$+ $L_2$), the focal length f and the dimension D of the effective illuminated region so that the amount of maximum difference is not more than 10%, in view of symmetry. Table 11 shows boundary conditions satisfying such condition ($\leq$10%), which are evaluated from the results of the computer simulation shown in Tables 8 to 10.

TABLE 11

| D/f | Range of Distance L |
|-----|---------------------|
| 0.1 | 0.082f $\leq$ L $\leq$ 1.918f |
| 0.2 | 0.189f $\leq$ L $\leq$ 1.810f |
| 0.3 | 0.314f $\leq$ L $\leq$ 1.686f |
| 0.4 | 0.496f $\leq$ L $\leq$ 1.504f |
| 0.5 | 0.65f $\leq$ L $\leq$ 1.35f |
| 0.6 | 0.712f $\leq$ L $\leq$ 1.288f |
| 0.7 | 0.7795f $\leq$ L $\leq$ 1.2205f |
| 0.8 | 0.872f $\leq$ L $\leq$ 1.128f |
| 0.9 | 0.9595f $\leq$ L $\leq$ 1.0405f |
| 1.0 | 1.0f $\leq$ L $\leq$ 1.0f |

Figure 17:
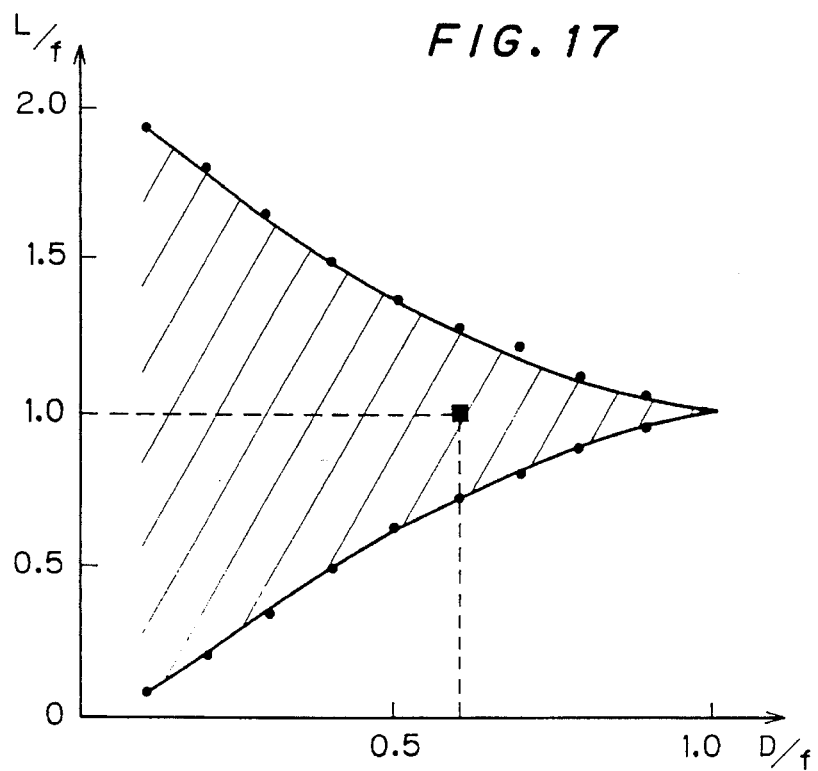
FIG. 17 illustrates boundary conditions when an upper limit of the amount of maximum difference is set at 10%.

FIG. 17 illustrates such boundary conditions, also. Referring to FIG. 17, the horizontal line represents the ratio (D/f) and the vertical line represents ratio (L/f). A region shown with oblique lines in FIG. 17 is of a range satisfying the aforementioned condition.

From Table 11 and FIG. 17, the boundary conditions are represented by the following inequality:

$$f\{1-K(1-(D/f)^2)\} \leq L \leq f\{1+K(1-(D/f)^2)\} \quad (4)$$

where f: focal length of the reflecting optical unit 21

D: dimension of a side of the square effective illuminated region

L: optical distance between the front principal point H and the illuminated surface 23

$K = 1 + 1.33(D/f)$ (when $0.3 > (D/f)$)

$K = 1.4$ (when $0.53 > (D/f) \geq 0.3$)

$K = 5(D/f)^2$ (when $0.53 \leq (D/f)$)

Therefore, if the illumination system satisfies the inequality (4), the amount of maximum difference is not more than 10% and illuminance distribution on the effective illuminated region of the illuminated surface 23 has excellent symmetry. If the illumination system does not satisfy the inequality (4), on the other hand, the amount of maximum difference exceeds 10% and illuminance distribution on the effective illuminated region of the illuminated surface 23 is asymmetrical. Although the upper limit of the amount of maximum difference is set at 10%, it is possible to illuminate the illuminated surface 23 with illuminance distribution being symmetrical with respect to the optical axis of illuminating system also when the upper limit thereof is set at another value. In this case, boundary conditions corresponding to the above value are evaluated similarly to the above case.

Symmetry of illuminance distribution of the surface illuminated by an illumination system will now be discussed when the illumination system is identical in structure to that shown in FIG. 16 and includes a reflecting optical unit 21 designed as follows:

(1) a light source 22 emits light with uniform illuminance distribution on an illuminated surface if a collimator is of a transmission type which is symmetrical with an optical axis;

(2) an off-axis angle θ is 20°;

(3) a focal length f of the reflecting optical unit 21 is 1000;

(4) the radii of curvature of spherical mirrors 21a and 21b are −3733.333 and −2461.538, respectively;

(5) a distance $L_3$ between the spherical mirrors 21a and 21b is 800;

(6) a distance $L_1$ between a front principal point H and the spherical mirror 21b is 150;

(7) a distance $L_4$ between the light source 22 and the spherical mirror 21a is 350;

(8) a distance $L (= L_1 + L_2)$ between the front principal point H and an illuminated surface 23 is 1000; and (9) a dimension D of a side of an square effective illuminated region of the illuminated surface 23 is set at 600.

Thus, the illumination system satisfies the following equations:

$D/f = 0.6$ $L = f$.

Hence, $L/f = 1$, and then a point (denoted by the mark ■) may be plotted in the oblique line region, as shown in FIG. 17. Consequently, it is predicted that the amount of maximum difference is not more than 10%.

In order to verify this, illuminance levels on respective points of the effective illuminated region are calculated in relation to the above setting (D= 600, and L= f= 1000). Table 12 shows the results.

TABLE 12

| Y\X | 0 | 100 | 200 | 300 |
|---|---|---|---|---|
| 300 | 117 | 118 | 124 | 133 |
| 200 | 107 | 109 | 113 | 122 |
| 100 | 102 | 103 | 108 | 116 |
| 0 | 100 | 101 | 106 | 114 |
| −100 | 102 | 103 | 108 | 116 |
| −200 | 107 | 108 | 113 | 123 |
| −300 | 116 | 118 | 124 | 135 |

As understood from Table 12, the illuminance levels on the illuminated surface 23 are substantially symmetrical with respect to a intersection C. Noting points (0, −300) and (0, 300), for example, the illuminance levels of these points are 116 and 117, respectively. Thus the amount of difference $DI_X$ evaluated on the basis of the equation (1) is as follows:

$$DI_X = \frac{|116 - 117|}{100} \cdot 100 = 1\ (\%)$$

Similarly, the amounts of difference $DI_X$ on the respective points of the illuminated surface 23 are evaluated. Accordingly, it is obtained that the maximum value thereof, that is the amount of maximum difference is 3%. Thus, the illuminated surface 23 can be illuminated with illuminance distribution having extremely excellent symmetry.

Since illuminance distribution having axial symmetry can be attained according to the above illumination system, it is possible also to uniformly illuminate the surface by adding appropriate means to the above illumination system as hereinabove described. For example, lenses having characteristics corresponding to the distribution shown in Table 12 may be added to the light source 22.

E. Fourth Embodiment

A Fresnel mirror may be employed in place of the spherical mirror 21 in the illumination system of the third embodiment. The Fresnel mirror (FIG. 9B) reflects incident light at a position which is different from that of a spherical mirror or a parabolic mirror having a continuous curved surface.

Figure 18:
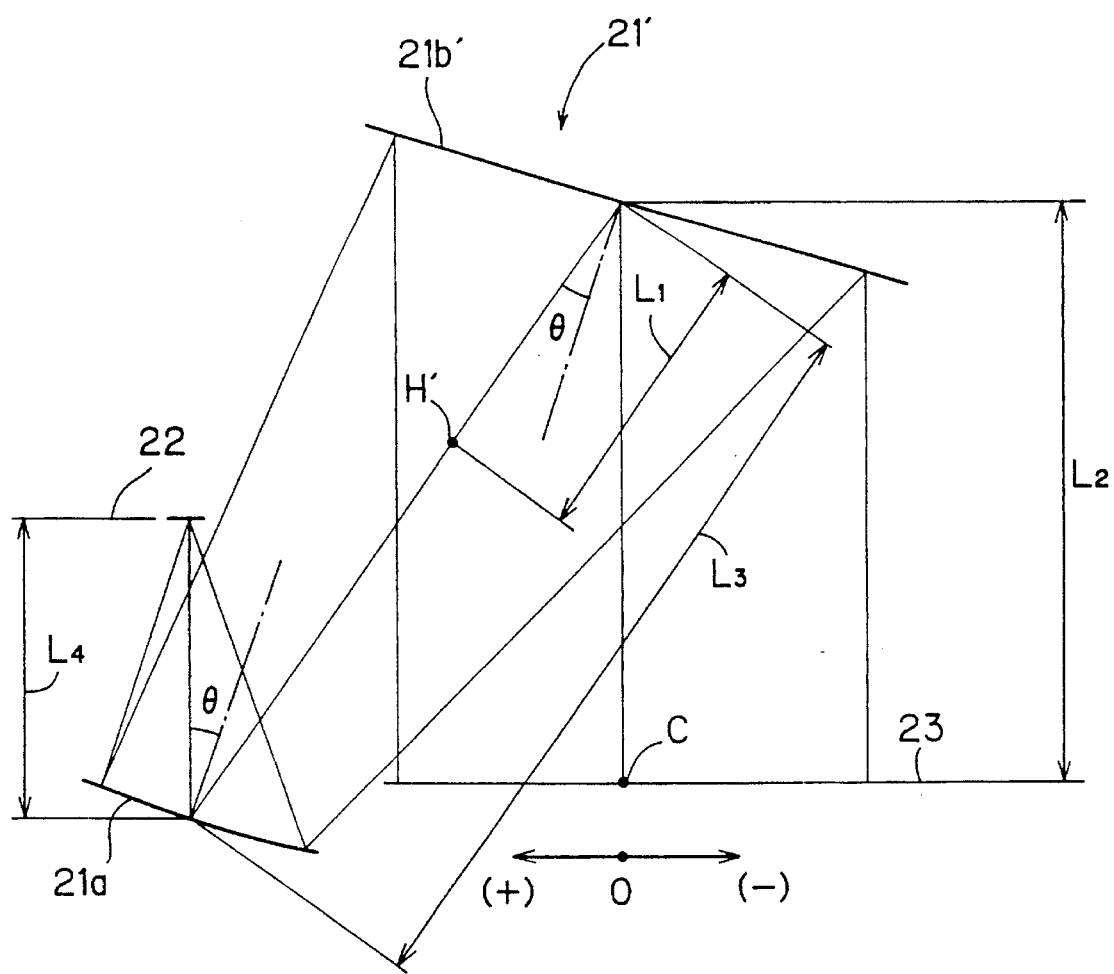
FIG. 18 illustrates a fourth embodiment of an illumination system according to the present invention.

Accordingly symmetry of illuminance distribution on the surface illuminated by an illumination system will also be discussed when the illumination system includes a reflecting optical unit 21' formed by a spherical mirror 21a and a Fresnel mirror 21b' shown in FIG. 18. The illumination system of the fourth embodiment is identical to that of the third embodiment, except for the reflecting optical unit 21'.

The amount of maximum difference in relation between ratios (L/f) and (D/f) in the illumination system is obtained by computer simulation under the following conditions:

(1) A light source 22 emits light with uniform illuminance distribution on an illuminated surface if a collimator is of a transmission type which is symmetrical to an optical axis;

(2) An off-axis angle θ is 15°;

(3) A focal length f of the reflecting optical unit 21' is 1000;

(4) The radii of curvature of the spherical mirror 21a and the Fresnel mirror 21b' are −1922.667 and −3551.724, respectively (where the radius of curvature of the Fresnel mirror 21b' represented the radius of curvature of a spherical mirror which is optically equivalent to the said mirror);

(5) A distance $L_3$ between the spherical mirror 21a and the Fresnel mirror 21b' is 1030;

(6) A distance $L_1$ between a front principal point H' and the Fresnel mirror 21b' is 450; and (7) A distance $L_4$ between the light source 22 and the spherical mirror 21a is 420.

Table 13 shows the results.

TABLE 13

| L/f | D/f 0.1 | 0.2 | 0.3 | 0.4 | 0.5 | 0.6 | 0.7 | 0.8 | 0.9 | 1.0 |
|---|---|---|---|---|---|---|---|---|---|---|
| 2.18 | 4% | 8% | 13% | 21% | X | X | X | X | | |
| 2.08 | 3% | 7% | 12% | 18% | 27% | X | X | X | | |
| 1.98 | 3% | 6% | 10% | 16% | 23% | X | X | X | | |
| 1.88 | 31 | 5% | 9% | 14% | 20% | X | X | X | | |
| 1.78 | 2% | 5% | 8% | 11% | 17% | 25% | X | X | | |
| 1.68 | 2% | 4% | 6% | 9% | 14% | 20% | X | X | | |
| 1.58 | 1% | 3% | 5% | 7% | 11% | 16% | 24% | X | | |
| 1.48 | 1% | 2% | 3% | 5% | 8% | 12% | 18% | 28% | | |
| 1.38 | 1% | 1% | 2% | 3% | 5% | 8% | 13% | 20% | | |
| 1.28 | 0% | 0% | 1% | 1% | 3% | 5% | 8% | 13% | | |
| 1.18 | 0% | 0% | 0% | 0% | 0% | 1% | 3% | 7% | | |
| 1.08 | 1% | 1% | 2% | 2% | 2% | 2% | 1% | 1% | | |
| 0.98 | 1% | 2% | 3% | 4% | 5% | 5% | 5% | 5% | | |
| 0.88 | 1% | 3% | 4% | 6% | 7% | 8% | 9% | 10% | | |
| 0.78 | 2% | 4% | 5% | 7% | 9% | 11% | 13% | 15% | | |
| 0.68 | 2% | 4% | 7% | 9% | 11% | 14% | 17% | 19% | | |
| 0.58 | 3% | 5% | 8% | 11% | 14% | 17% | 20% | 24% | | |
| 0.48 | 3% | 6% | 9% | 12% | 16% | 19% | 23% | 28% | | |
| 0.38 | | | | | | | | | | |
| 0.28 | | | | | | | | | | |
| 0.18 | | | | | | | | | | |

Further, the amounts of maximum difference in relation between the ratios (L/f) and (D/f) are evaluated similarly to the above under the following conditions in addition to the above conditions (1) to (3):

(4) The radii of curvature of the spherical mirror 21a and the Fresnel mirror 21b' are −1281.25 and −3280, respectively;

(5) The distance $L_3$ between the spherical mirror 21a and the Fresnel mirror 21b' is 1230;

(6) The distance $L_1$ between the front principal point H' and the Fresnel mirror 21b' is 480; and (7) The distance $L_4$ between the light source 22 and the spherical mirror 21a is 250.

Table 14 shows the results.

TABLE 14

| L/f | D/f 0.1 | 0.2 | 0.3 | 0.4 | 0.5 | 0.6 | 0.7 | 0.8 | 0.9 | 1.0 |
|---|---|---|---|---|---|---|---|---|---|---|
| 2.18 | 3% | 7% | 12% | 18% | 26% | X | X | X | | |
| 2.08 | 3% | 6% | 10% | 16% | 23% | X | X | X | | |
| 1.98 | 3% | 5% | 9% | 14% | 20% | X | X | X | | |
| 1.88 | 2% | 5% | 8% | 12% | 17% | 25% | X | X | | |
| 1.78 | 2% | 4% | 6% | 10% | 14% | 21% | X | X | | |
| 1.68 | 1% | 3% | 5% | 8% | 12% | 17% | 27% | X | | |
| 1.58 | 1% | 2% | 4% | 6% | 9% | 14% | 21% | X | | |
| 1.48 | 1% | 2% | 3% | 4% | 7% | 10% | 16% | 26% | | |
| 1.38 | 0% | 1% | 2% | 3% | 4% | 7% | 12% | 19% | | |
| 1.28 | 0% | 0% | 0% | 1% | 2% | 4% | 7% | 13% | | |
| 1.18 | 0% | 1% | 1% | 1% | 0% | 1% | 3% | 7% | | |
| 1.08 | 1% | 1% | 2% | 2% | 2% | 2% | 1% | 2% | | |
| 0.98 | 1% | 2% | 3% | 4% | 5% | 5% | 4% | 3% | | |
| 0.88 | 1% | 3% | 4% | 5% | 7% | 8% | 8% | 8% | | |
| 0.78 | 2% | 4% | 5% | 7% | 9% | 10% | 11% | 12% | | |
| 0.68 | 2% | 4% | 6% | 8% | 11% | 13% | 15% | 16% | | |
| 0.58 | 2% | 5% | 7% | 10% | 12% | 15% | 18% | 20% | | |
| 0.48 | | | | | | | | | | |

TABLE 14-continued

| L/f | D/f 0.1 | 0.2 | 0.3 | 0.4 | 0.5 | 0.6 | 0.7 | 0.8 | 0.9 | 1.0 |
|---|---|---|---|---|---|---|---|---|---|---|
| 0.38 | | | | | | | | | | |
| 0.28 | | | | | | | | | | |
| 0.18 | | | | | | | | | | |

Further, the amounts of maximum difference in relation between the ratios (L/f) and (D/f) are evaluated similarly to the above under the following conditions in addition to the above conditions (1) to (3):

(4) The radii of curvature of the spherical mirror 21a and the Fresnel mirror 21b' are −2592 and −3891.892, respectively;

(5) The distance $L_3$ between the spherical mirror 21a and the Fresnel mirror 21b' is 720;

(6) The distance $L_1$ between the front principal point H' and the Fresnel mirror 21b' is 350; and (7) The distance $L_4$ between the light source 22 and the spherical mirror 21a is 630.

Table 15 shows the results.

TABLE 15

| L/f | D/f 0.1 | 0.2 | 0.3 | 0.4 | 0.5 | 0.6 | 0.7 | 0.8 | 0.9 | 1.0 |
|---|---|---|---|---|---|---|---|---|---|---|
| 2.18 | 5% | 10% | 16% | 25% | X | X | X | X | | |
| 2.08 | 4% | 9% | 14% | 22% | X | X | X | X | | |
| 1.98 | 4% | 8% | 13% | 19% | 28% | X | X | X | | |
| 1.88 | 3% | 7% | 11% | 16% | 24% | X | X | X | | |
| 1.78 | 3% | 6% | 9% | 14% | 20% | 29% | X | X | | |
| 1.68 | 2% | 5% | 7% | 11% | 16% | 24% | X | X | | |
| 1.58 | 2% | 4% | 6% | 9% | 13% | 18% | 27% | X | | |
| 1.48 | 1% | 3% | 4% | 6% | 9% | 13% | 20% | 29% | | |
| 1.38 | 1% | 2% | 3% | 4% | 6% | 10% | 13% | 20% | | |
| 1.28 | 0% | 1% | 1% | 2% | 3% | 5% | 7% | 11% | | |
| 1.18 | 0% | 0% | 0% | 0% | 0% | 0% | 2% | 4% | | |
| 1.08 | 1% | 1% | 2% | 3% | 3% | 3% | 3% | 3% | | |
| 0.98 | 1% | 2% | 3% | 5% | 6% | 7% | 8% | 10% | | |
| 0.88 | 2% | 3% | 5% | 7% | 8% | 11% | 13% | 15% | | |
| 0.78 | 2% | 4% | 6% | 9% | 11% | 14% | 17% | 21% | | |
| 0.68 | 2% | 5% | 8% | 10% | 14% | 17% | 21% | 26% | | |
| 0.58 | 3% | 6% | 9% | 12% | 16% | 20% | 25% | X | | |
| 0.48 | 3% | 7% | 10% | 14% | 18% | 23% | 29% | X | | |
| 0.38 | 4% | 8% | 12% | 16% | 21% | 26% | X | X | | |
| 0.28 | | | | | | | | | | |
| 0.18 | | | | | | | | | | |

Further, computer simulation is also made for the case of employing a Fresnel mirror 21a' in place of the spherical mirror 21a. Namely, the amount of maximum difference in relation between the ratios (L/f) and (D/f) is evaluated similarly to the above under the following conditions in addition to the above conditions (1) to (3):

(4) The radii of curvature of the Fresnel mirrors 21a' and 21b' are −2400 and −4000, respectively;

(5) The distance $L_3$ between the Fresnel mirrors 21a' and 21b' is 800 (where the radius of curvature of the Fresnel mirror 21a' represented the radius of curvature of a spherical mirror which is optically equivalent to the said mirror);

(6) The distance $L_1$ between the front principal point H' and the Fresnel mirror 21b' is 400; and (7) The distance $L_4$ between the light source 22 and the Fresnel mirror 21a' is 600.

Table 16 shows the results.

TABLE 16

| L/f | D/f 0.1 | 0.2 | 0.3 | 0.4 | 0.5 | 0.6 | 0.7 | 0.8 | 0.9 | 1.0 |
|---|---|---|---|---|---|---|---|---|---|---|
| 2.18 | 5% | 11% | 20% | X | X | X | X | X | | |
| 2.08 | 5% | 10% | 17% | 28% | X | X | X | X | | |
| 1.98 | 4% | 9% | 15% | 24% | X | X | X | X | | |
| 1.88 | 4% | 8% | 13% | 21% | X | X | X | X | | |
| 1.78 | 3% | 6% | 11% | 17% | 27% | X | X | X | | |
| 1.68 | 3% | 5% | 9% | 14% | 21% | X | X | X | | |
| 1.58 | 2% | 4% | 7% | 11% | 17% | 26% | X | X | | |
| 1.48 | 1% | 3% | 5% | 8% | 12% | 19% | X | X | | |
| 1.38 | 1% | 2% | 3% | 5% | 8% | 12% | 19% | X | | |
| 1.28 | 0% | 1% | 1% | 2% | 4% | 7% | 11% | 18% | | |
| 1.18 | 0% | 0% | 0% | 0% | 0% | 1% | 3% | 7% | | |
| 1.08 | 1% | 1% | 2% | 3% | 3% | 3% | 3% | 3% | | |
| 0.98 | 1% | 2% | 4% | 5% | 6% | 8% | 9% | 11% | | |
| 0.88 | 2% | 3% | 5% | 7% | 9% | 12% | 15% | 18% | | |
| 0.78 | 2% | 4% | 7% | 9% | 12% | 16% | 20% | 24% | | |
| 0.68 | 3% | 5% | 8% | 12% | 15% | 19% | 24% | X | | |
| 0.58 | 3% | 6% | 10% | 14% | 18% | 23% | 28% | X | | |
| 0.48 | 4% | 7% | 11% | 16% | 20% | 26% | X | X | | |
| 0.38 | | | | | | | | | | |
| 0.28 | | | | | | | | | | |
| 0.18 | | | | | | | | | | |

Table 17 shows boundary conditions satisfying such condition that the upper limit of the amount of maximum difference is 10%, which are evaluated from the results of simulation shown in Tables 13 to 16.

TABLE 17

| D/f | Range of Distance L |
|---|---|
| 0.1 | 0.129f ≦ L ≦ 2.231f |
| 0.2 | 0.273f ≦ L ≦ 2.086f |
| 0.3 | 0.429f ≦ L ≦ 1.932f |
| 0.4 | 0.628f ≦ L ≦ 1.732f |
| 0.5 | 0.738f ≦ L ≦ 1.623f |
| 0.6 | 0.772f ≦ L ≦ 1.588f |
| 0.7 | 0.868f ≦ L ≦ 1.492f |
| 0.8 | 0.998f ≦ L ≦ 1.361f |

Figure 19:
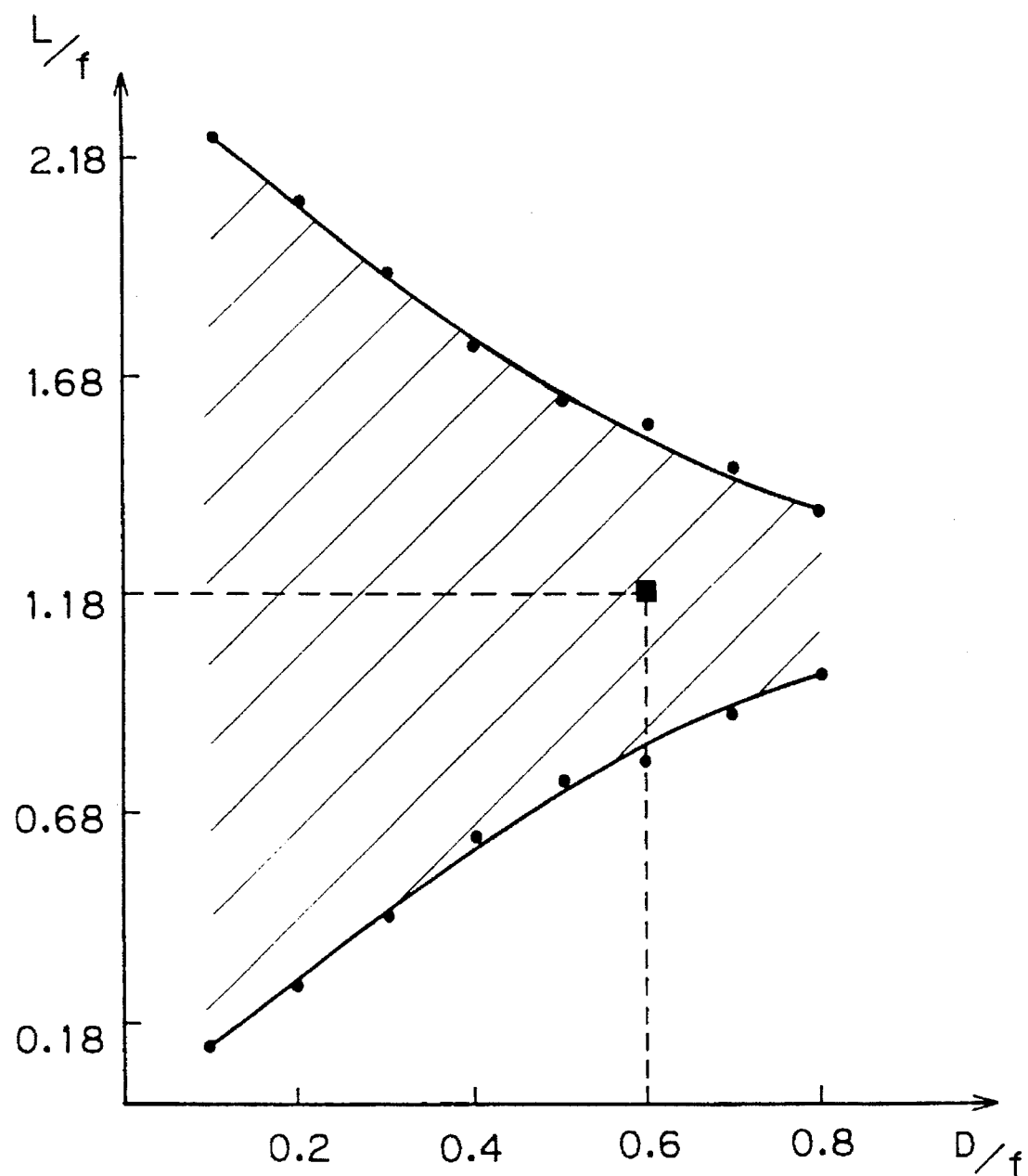
FIG. 19 illustrates boundary conditions when an upper limit of the amount of maximum difference is set at 10%.

FIG. 19 illustrates the boundary conditions, also. From Table 17 and FIG. 19, the boundary conditions are represented in the following approximate expression:

$$1.18 f\{1-K(1-(D/f)^2)\} \leq L \leq 1.18 f\{1+K(1-(D/f)^2)\} \quad (5)$$

where f: focal length of the reflecting optical unit 21'

D: dimension of the side of the square effective illuminated region

L: optical distance between the front principal point H' and the illuminated surface 23

$K = 1 + (D/f)$ (when $0.3 > (D/f)$)

$K = 1.3$ (when $0.47 > (D/f) \geq 0.3$)

$K = 6(D/f)^2$ (when $0.8 \geq (D/f) \geq 0.47$)

Thus, when the illumination system satisfies the inequality (5), the amount of maximum difference is not more than 10% and illuminance distribution on the effective illuminated region of the illuminated surface 23 has excellent symmetry. When the illumination system does not satisfy the inequality (5), on the other hand, the amount of maximum difference exceeds 10% and illuminance distribution on the effective illuminated region of the illuminated region 23 is asymmetrical. While the above description has been made with reference to the case of setting the upper limit of the amount of maximum difference at 10%, it is possible to light the illuminated surface with illuminance distribution which is symmetrical with respect to the optical axis of the illuminating system also when the upper limit thereof is set at another value. In this case, boundary conditions corresponding to the upper limit are evaluated, similarly to the above. Thereafter distance L, focal length f and dimension D are set so as to satisfy the boundary conditions, respectively.

Symmetry of illuminance distribution of the surface illuminated by an illumination system will now be discussed when the illumination system is identical in structure to that shown in FIG. 18 and includes a reflecting optical unit 21' designed as follows:

(1) A light source 22 emits illuminating light with uniform illuminance distribution on an illuminated surface if a collimator is of a transmission is type which symmetrical to an optical axis;

(2) An off-axis angle θ is 17°;

(3) A focal length f of the reflecting optical unit 21' is 1000;

(4) The radii of curvature of a spherical mirror 21a and a Fresnel mirror 21b' are −2000 and −3333.333, respectively;

(5) A distance $L_3$ between the spherical mirror 21a and the Fresnel mirror 21b' is 1000;

(6) A distance $L_1$ between a front principal point H' and the Fresnel mirror 21b' is 400;

(7) A distance $L_4$ between the light source 22 and the spherical mirror 21a is 400;

(8) A distance L $(= L_1 + L_2)$ between the front principal point H' and the illuminated surface 23 is 1180; and (9) A dimension D of a side of a square effective illuminated region of the illuminated surface 23 is of 600. Thus, the illumination system satisfies the following equations:

D/f = 0.6

L = 1.18 f.

Hence, L/f = 1.18. Therefore a point (denoted by the mark ■) may be plotted on the oblique line region, as shown in FIG. 17, and hence it is predicted that the amount of maximum difference is not more than 10%.

In order to verify this, illuminance levels on the illuminated surface 23 in relation to the above setting (D= 600, L= 1180 and f= 1000) are calculated. Table 18 shows the results.

TABLE 18

| Y\X | 0 | 100 | 200 | 300 |
|---|---|---|---|---|
| 300 | 118 | 120 | 125 | 136 |
| 200 | 108 | 110 | 114 | 124 |
| 100 | 102 | 104 | 108 | 117 |
| 0 | 100 | 101 | 106 | 115 |
| −100 | 101 | 103 | 108 | 117 |
| −200 | 107 | 103 | 114 | 124 |
| −300 | 118 | 120 | 127 | 139 |

As understood from Table 18, the illuminance levels on the illuminated surface 23 are substantially symmetrical with respect to a intersection C (0, 0). Noting points (0, −300) and (0, 300), for example, the illuminance levels on these points are 118 and 118. Thus the amount of maximum difference $DI_X$ evaluated on the basis of the equation (1) is as follows:

$$DI_X = \frac{|118-118|}{100} \cdot 100 = 0 \, (\%)$$

Similarly, the amounts of difference $DI_X$ on the respective points of the illuminated surface 23 are evaluated. The maximum value thereby obtained that is, the amount of maximum difference is 3%. Thus, the illuminated surface 23 can be illuminated with illuminance distribution having extremely excellent symmetry.

Since illuminance distribution having axial symmetry can be attained by the above illumination system system, it is possible to uniformly illuminate the surface 23 in a similar manner to the above.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An illumination system for illuminating a surface by collimated light, said illumination system comprising:

a reflecting element having a finite focal length; and a light source located at a point close to a focal point of said reflecting element, said point being deviated from a principal axis of said reflecting element; wherein said illumination system satisfies the following inequality:

$$f\{1-K(1-(D/f)^2)\} \leq L \leq f\{1+K(1-(D/f)^2)\}$$

where f: focal length of said reflecting element

D: dimension of said surface measured in a direction in which the illumination varies in an asymmetrical manner due to the positional deviation of the light source from the principal axis of the reflecting element L: distance between said reflecting element and said surface K= 0.67 (when 0.58> (D/f))

K= 2(D/f)$^2$ (when 0.58≦ (D/f)).

2. An illumination system of claim 1, wherein said reflecting element is provided with a concave reflecting surface which is symmetrical with respect to said principal axis of said reflecting element.

3. An illumination system of claim 2, wherein said reflecting element is a spherical mirror.

4. An illumination system of claim 2, wherein said reflecting element is a parabolic mirror.

5. An illumination system for illuminating a surface by collimated light said illumination system comprising:

reflecting means having a finite focal length, said reflecting means comprising a plurality of reflecting elements, principal axes of said reflecting elements being shifted from each other, all of said reflecting elements being spherical or parabolic mirrors;

a light located at a point close to a focal point of said reflecting means, said point being deviated from a principal axis of the reflecting element nearest said light source, and a front principal point of said reflecting means being located on the light source side with respect to the reflecting element nearest to said surface; and wherein the illumination system satisfies the following inequality:

$$F\{1-K(1-(D/f^2)\} \leq L \leq f\{1=K(1-(D/f)^2)\}$$

where f: focal length of said reflecting means

D: dimension of said surface measured in a direction in which the illumination varies in an asymmetrical manner due to the positional deviation of the light source from the principal axis of the reflecting element L: distance between said front principal point of said reflecting means and said surface K= 1+ 1.33(D/f) (when 0.3> (D/f))

K= 1.4 (when 0.53> (D/f)≦(D/f))

K= 5 (D/f)$^2$ (when 0.53≦(D/f)).

6. An illumination system for illuminating a surface by collimated light, said illumination system comprising:

reflecting means for reflecting light, said reflecting means having a finite focal length and comprising a plurality of reflecting elements each having a symmetrical configuration and a finite focal length, principal axes of said reflecting elements being shifted from each other; and a light source for radiating diverging light located at a point close to a focal point of said reflecting means, said point being deviated from a principal axis of the reflecting element nearest said light source, said principal axes of the reflecting elements being parallel to one another.

7. An illumination system of claim 6 wherein a front principal point of said reflecting means is located in the light source side with respect to the reflecting element nearest to said surface.

8. An illumination system of claim 7, wherein all of said reflecting elements are spherical or parabolic mirrors.

9. An illumination system of claim 7, wherein said reflecting means comprises a Fresnel mirror.

10. An illumination system of claim 9, wherein the following inequality is satisfied:

$$1.18 \, f\{1-K(1-(D/f)^2)\} \leq L \leq 1.18 \, f\{1+K(1-(D/f)^2)\}$$

where f: focal length of said reflecting means

D: dimension of said surface

L: distance between said front principal point of said reflecting means and said surface K= 1+ (D/f) (when 0.3> (D/f))

K= 1.3 (when 0.47> (D/f)≧0.3)

K= 6(D/f)$^2$ (when 0.8≧ (D/f)≧0.47).

* * * * *